(12) United States Patent  
Arghavani et al.

(10) Patent No.: US 11,011,379 B2  
(45) Date of Patent: May 18, 2021

(54) CAPPED ALD FILMS FOR DOPING FIN-SHAPED CHANNEL REGIONS OF 3-D IC TRANSISTORS

(71) Applicant: Lam Research Corporation, Fremont, CA (US)

(72) Inventors: Reza Arghavani, Scotts Valley, CA (US); Samantha Tan, Fremont, CA (US); Bhadri N. Varadarajan, Beaverton, OR (US); Adrien LaVoie, Newberg, OR (US); Ananda K. Banerji, West Linn, OR (US); Jun Qian, Sherwood, OR (US); Shankar Swaminathan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/556,122

(22) Filed: Aug. 29, 2019

(65) Prior Publication Data

US 2019/0385850 A1    Dec. 19, 2019

Related U.S. Application Data

(63) Continuation of application No. 15/976,793, filed on May 10, 2018, now Pat. No. 10,559,468, and a
(Continued)

(51) Int. Cl.
*H01L 21/223*  (2006.01)
*H01L 21/22*   (2006.01)
(Continued)

(52) U.S. Cl.
CPC .......... *H01L 21/223* (2013.01); *C23C 16/045* (2013.01); *C23C 16/45529* (2013.01);
(Continued)

(58) Field of Classification Search
None
See application file for complete search history.

(56) References Cited

U.S. PATENT DOCUMENTS

| 4,500,563 A | 2/1985 | Ellenberger et al. |
| 5,094,984 A | 3/1992 | Liu et al. |

(Continued)

FOREIGN PATENT DOCUMENTS

| CN | 1732288 A | 2/2006 |
| CN | 1768158 A | 5/2006 |

(Continued)

OTHER PUBLICATIONS

U.S. Office Action dated Mar. 15, 2013 issued in U.S. Appl. No. 13/084,399.
(Continued)

*Primary Examiner* — Bo B Jang
(74) *Attorney, Agent, or Firm* — Weaver Austin Villeneuve & Sampson LLP

(57) ABSTRACT

Disclosed herein are methods of doping a fin-shaped channel region of a partially fabricated 3-D transistor on a semiconductor substrate. The methods may include forming a multilayer dopant-containing film on the substrate, forming a capping film comprising a silicon carbide material, a silicon nitride material, a silicon carbonitride material, or a combination thereof, the capping film located such that the multilayer dopant-containing film is located in between the substrate and the capping film, and driving dopant from the dopant-containing film into the fin-shaped channel region. Multiple dopant-containing layers of the film may be formed by an atomic layer deposition process which includes adsorbing a dopant-containing film precursor such that it forms an adsorption-limited layer on the substrate and reacting adsorbed dopant-containing film precursor. Also disclosed herein are multi-station substrate processing appa-
(Continued)

ratuses for doping the fin-shaped channel regions of partially fabricated 3-D transistors.

12 Claims, 11 Drawing Sheets

Related U.S. Application Data continuation of application No. 14/194,549, filed on Feb. 28, 2014, now Pat. No. 9,997,357, which is a continuation-in-part of application No. 13/607,386, filed on Sep. 7, 2012, now Pat. No. 8,956,983, which is a continuation-in-part of application No. 13/242,084, filed on Sep. 23, 2011, now Pat. No. 8,637,411, which is a continuation-in-part of application No. 13/084,305, filed on Apr. 11, 2011, now abandoned, which is a continuation of application No. 13/084,399, filed on Apr. 11, 2011, now Pat. No. 8,728,956.

(60) Provisional application No. 61/649,114, filed on May 18, 2012, provisional application No. 61/417,807, filed on Nov. 29, 2010, provisional application No. 61/379,081, filed on Sep. 1, 2010, provisional application No. 61/372,367, filed on Aug. 10, 2010, provisional application No. 61/324,710, filed on Apr. 15, 2010.

(51) Int. Cl.

| | | |
|---|---|---|
| *C23C 16/52* | (2006.01) | |
| *C23C 16/455* | (2006.01) | |
| *H01L 21/67* | (2006.01) | |
| *H01L 29/66* | (2006.01) | |
| *H01L 21/225* | (2006.01) | |
| *C23C 16/04* | (2006.01) | |
| *C23C 16/50* | (2006.01) | |

(52) U.S. Cl.
CPC ........ *C23C 16/45544* (2013.01); *C23C 16/50* (2013.01); *C23C 16/52* (2013.01); *H01L 21/2225* (2013.01); *H01L 21/2252* (2013.01); *H01L 21/67155* (2013.01); *H01L 21/67207* (2013.01); *H01L 29/66803* (2013.01)

(56) References Cited

U.S. PATENT DOCUMENTS

| | | | |
|---|---|---|---|
| 5,223,443 | A | 6/1993 | Chinn et al. |
| 5,230,929 | A | 7/1993 | Caporiccio et al. |
| 5,318,928 | A | 6/1994 | Gegenwart et al. |
| 5,344,454 | A | 9/1994 | Clarke et al. |
| 5,496,608 | A | 3/1996 | Matsuda et al. |
| 5,593,914 | A | 1/1997 | Evans, Jr. et al. |
| 5,670,432 | A | 9/1997 | Tsai |
| 5,856,003 | A | 1/1999 | Chiu |
| 5,874,368 | A | 2/1999 | Laxman et al. |
| 5,916,365 | A | 6/1999 | Sherman |
| 5,932,286 | A | 8/1999 | Beinglass et al. |
| 6,069,058 | A | 5/2000 | Hong |
| 6,100,202 | A | 8/2000 | Lin et al. |
| 6,156,149 | A | 12/2000 | Cheung et al. |
| 6,218,293 | B1 | 4/2001 | Kraus et al. |
| 6,270,572 | B1 | 8/2001 | Kim et al. |
| 6,346,741 | B1 | 2/2002 | Van Buskirk et al. |
| 6,391,803 | B1 | 5/2002 | Kim et al. |
| 6,399,221 | B1* | 6/2002 | Marks ............... B82Y 10/00 313/504 |
| 6,416,822 | B1 | 7/2002 | Chiang et al. |
| 6,428,859 | B1 | 8/2002 | Chiang et al. |
| 6,465,272 | B1* | 10/2002 | Davis, Jr. ............ B82Y 10/00 378/34 |
| 6,468,924 | B2 | 10/2002 | Lee et al. |
| 6,482,726 | B1 | 11/2002 | Aminpur et al. |
| 6,509,601 | B1 | 1/2003 | Lee et al. |
| 6,528,430 | B2 | 3/2003 | Kwan et al. |
| 6,551,893 | B1 | 4/2003 | Zheng et al. |
| 6,569,501 | B2 | 5/2003 | Chiang et al. |
| 6,576,053 | B1 | 6/2003 | Kim et al. |
| 6,576,345 | B1 | 6/2003 | Van Cleemput et al. |
| 6,602,784 | B2 | 8/2003 | Sneh |
| 6,632,478 | B2 | 10/2003 | Gaillard et al. |
| 6,645,574 | B1 | 11/2003 | Lee et al. |
| 6,689,220 | B1 | 2/2004 | Nguyen |
| 6,723,595 | B2 | 4/2004 | Park |
| 6,730,614 | B1 | 5/2004 | Lim et al. |
| 6,743,738 | B2 | 6/2004 | Todd |
| 6,756,318 | B2 | 6/2004 | Nguyen et al. |
| 6,765,303 | B1 | 7/2004 | Krivokapic et al. |
| 6,809,421 | B1 | 10/2004 | Hayasaka et al. |
| 6,828,218 | B2 | 12/2004 | Kim et al. |
| 6,835,417 | B2 | 12/2004 | Saenger et al. |
| 6,861,356 | B2 | 3/2005 | Matsuse et al. |
| 6,884,466 | B2 | 4/2005 | Kaloyeros et al. |
| 6,930,058 | B2 | 8/2005 | Hill et al. |
| 6,930,060 | B2 | 8/2005 | Chou et al. |
| 6,943,092 | B2 | 9/2005 | Kim et al. |
| 6,962,876 | B2 | 11/2005 | Ahn et al. |
| 6,987,240 | B2 | 1/2006 | Jennings et al. |
| 7,001,844 | B2 | 2/2006 | Chakravarti et al. |
| 7,041,335 | B2 | 5/2006 | Chung |
| 7,077,904 | B2 | 7/2006 | Cho et al. |
| 7,081,271 | B2 | 7/2006 | Chung et al. |
| 7,084,076 | B2 | 8/2006 | Park et al. |
| 7,097,886 | B2 | 8/2006 | Moghadam et al. |
| 7,109,129 | B1 | 9/2006 | Papasouliotis |
| 7,115,166 | B2 | 10/2006 | Vaartstra et al. |
| 7,115,528 | B2 | 10/2006 | Vaartstra et al. |
| 7,122,222 | B2 | 10/2006 | Xiao et al. |
| 7,122,464 | B2 | 10/2006 | Vaarstra |
| 7,125,815 | B2 | 10/2006 | Vaartstra |
| 7,132,353 | B1 | 11/2006 | Xia et al. |
| 7,141,278 | B2 | 11/2006 | Koh et al. |
| 7,148,155 | B1 | 12/2006 | Tarafdar et al. |
| 7,151,039 | B2 | 12/2006 | Lee et al. |
| 7,172,792 | B2 | 2/2007 | Wang et al. |
| 7,176,084 | B2 | 2/2007 | Lee et al. |
| 7,205,187 | B2 | 4/2007 | Leith et al. |
| 7,223,649 | B2 | 5/2007 | Oh et al. |
| 7,235,484 | B2 | 6/2007 | Nguyen et al. |
| 7,241,686 | B2 | 7/2007 | Marcadal et al. |
| 7,244,668 | B2 | 7/2007 | Kim |
| 7,250,083 | B2 | 7/2007 | Sneh |
| 7,259,050 | B2 | 8/2007 | Chen et al. |
| 7,261,919 | B2 | 8/2007 | Mehregany et al. |
| 7,294,582 | B2 | 11/2007 | Haverkort et al. |
| 7,297,641 | B2 | 11/2007 | Todd et al. |
| 7,300,885 | B2 | 11/2007 | Hasebe et al. |
| 7,314,835 | B2 | 1/2008 | Ishizaka et al. |
| 7,341,959 | B2 | 3/2008 | Brcka |
| 7,351,668 | B2 | 4/2008 | Chou et al. |
| 7,361,538 | B2 | 4/2008 | Luan et al. |
| 7,361,611 | B2 | 4/2008 | Chakravarti et al. |
| 7,390,743 | B2 | 6/2008 | Shin |
| 7,393,561 | B2 | 7/2008 | Paranjpe |
| 7,399,388 | B2 | 7/2008 | Moghadam et al. |
| 7,419,888 | B2 | 9/2008 | Yang et al. |
| 7,435,454 | B2 | 10/2008 | Brcka |
| 7,435,684 | B1 | 10/2008 | Lang et al. |
| 7,462,571 | B2 | 12/2008 | Hasebe et al. |
| 7,482,247 | B1 | 1/2009 | Papasouliotis et al. |
| 7,488,694 | B2 | 2/2009 | Kim et al. |
| 7,507,676 | B2 | 3/2009 | Chou et al. |
| 7,510,984 | B2 | 3/2009 | Saito et al. |
| 7,521,331 | B2 | 4/2009 | Park et al. |
| 7,524,762 | B2 | 4/2009 | Marcadal et al. |
| 7,544,615 | B2 | 6/2009 | Vaartstra |
| 7,572,052 | B2 | 8/2009 | Ravi et al. |
| 7,592,231 | B2 | 9/2009 | Cheng et al. |
| 7,595,010 | B2 | 9/2009 | Chakravarti et al. |
| 7,601,648 | B2 | 10/2009 | Chua et al. |

(56) References Cited

U.S. PATENT DOCUMENTS

| | | |
|---|---|---|
| 7,615,438 B2 | 11/2009 | Ahn et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,745,346 B2 | 6/2010 | Hausmann et al. |
| 7,758,920 B2 | 7/2010 | Hasebe et al. |
| 7,776,733 B2 | 8/2010 | Hasegawa |
| 7,790,633 B1 | 9/2010 | Tarafdar et al. |
| 7,825,039 B2 | 11/2010 | Takahashi et al. |
| 7,863,190 B1 | 1/2011 | Papasouliotis et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,338,312 B2 | 12/2012 | Sato et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,955 B2 | 5/2014 | LaVoie et al. |
| 8,728,956 B2 | 5/2014 | LaVoie et al. |
| 8,829,636 B2 | 9/2014 | Ohchi et al. |
| 8,846,484 B2 | 9/2014 | Lee et al. |
| 8,956,983 B2 | 2/2015 | Swaminathan et al. |
| 8,999,859 B2 | 4/2015 | Swaminathan et al. |
| 9,023,693 B1 | 5/2015 | Lin et al. |
| 9,076,646 B2 | 7/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,406,693 B1 | 8/2016 | Pang et al. |
| 9,502,238 B2 | 11/2016 | Danek et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,611,544 B2 | 4/2017 | Lavoie et al. |
| 9,627,221 B1 | 4/2017 | Zaitsu et al. |
| 9,673,041 B2 | 6/2017 | Swaminathan et al. |
| 9,685,320 B2 | 6/2017 | Kang et al. |
| 9,773,643 B1 | 9/2017 | Singhal et al. |
| 9,786,570 B2 | 10/2017 | Kang et al. |
| 9,793,110 B2 | 10/2017 | Kang et al. |
| 9,875,891 B2 | 1/2018 | Henri et al. |
| 9,892,917 B2 | 2/2018 | Swaminathan et al. |
| 9,997,357 B2 | 6/2018 | Arghavani et al. |
| 10,008,428 B2 | 6/2018 | Kang et al. |
| 10,037,884 B2 | 7/2018 | Ou et al. |
| 10,043,655 B2 | 8/2018 | Swaminathan et al. |
| 10,043,657 B2 | 8/2018 | Swaminathan et al. |
| 10,062,563 B2 | 8/2018 | Kumar et al. |
| 10,269,559 B2 | 4/2019 | Abel et al. |
| 10,361,076 B2 | 7/2019 | Kang et al. |
| 10,373,806 B2 | 8/2019 | Singhal et al. |
| 10,559,468 B2 | 2/2020 | Arghavani et al. |
| 10,679,848 B2 | 6/2020 | Kumar et al. |
| 10,741,458 B2 | 8/2020 | Kang et al. |
| 2001/0041250 A1 | 11/2001 | Werkhoven et al. |
| 2002/0066411 A1 | 6/2002 | Chiang et al. |
| 2002/0076507 A1 | 6/2002 | Chiang et al. |
| 2002/0153101 A1 | 10/2002 | Nguyen et al. |
| 2002/0175393 A1 | 11/2002 | Baum et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0200917 A1 | 10/2003 | Vaartstra |
| 2003/0216006 A1 | 11/2003 | Li et al. |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0151845 A1 | 8/2004 | Nguyen et al. |
| 2004/0157472 A1 | 8/2004 | Sugino et al. |
| 2004/0171280 A1 | 9/2004 | Conley, Jr. et al. |
| 2004/0219746 A1 | 11/2004 | Vaartstra et al. |
| 2004/0219784 A1 | 11/2004 | Kang et al. |
| 2004/0231799 A1 | 11/2004 | Lee et al. |
| 2005/0005851 A1 | 1/2005 | Keshner et al. |
| 2005/0009368 A1 | 1/2005 | Vaartsra |
| 2005/0042865 A1 | 2/2005 | Cabral et al. |
| 2005/0079661 A1 | 4/2005 | Cho et al. |
| 2005/0109276 A1 | 5/2005 | Iyer et al. |
| 2005/0118837 A1 | 6/2005 | Todd et al. |
| 2005/0142795 A1 | 6/2005 | Ahn et al. |
| 2005/0158983 A1 | 7/2005 | Hoshi et al. |
| 2005/0159017 A1 | 7/2005 | Kim et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0276930 A1* | 12/2005 | Gates .................. H01L 21/3122 427/551 |
| 2005/0282346 A1 | 12/2005 | Barth et al. |
| 2005/0287775 A1 | 12/2005 | Hasebe et al. |
| 2006/0003557 A1 | 1/2006 | Cabral et al. |
| 2006/0009041 A1 | 1/2006 | Iyer et al. |
| 2006/0030148 A1 | 2/2006 | Seutter et al. |
| 2006/0032442 A1 | 2/2006 | Hasebe |
| 2006/0032443 A1 | 2/2006 | Hasebe et al. |
| 2006/0084283 A1 | 4/2006 | Paranjpe et al. |
| 2006/0088985 A1 | 4/2006 | Haverkort et al. |
| 2006/0105106 A1 | 5/2006 | Balseanu et al. |
| 2006/0165890 A1 | 7/2006 | Kaushal et al. |
| 2006/0178019 A1 | 8/2006 | Senzaki et al. |
| 2006/0183055 A1 | 8/2006 | O'Neill et al. |
| 2006/0199357 A1 | 9/2006 | Wan et al. |
| 2006/0216418 A1 | 9/2006 | Matsuura |
| 2006/0228868 A1 | 10/2006 | Ahn et al. |
| 2006/0244100 A1 | 11/2006 | Ahn et al. |
| 2006/0286774 A1 | 12/2006 | Singh et al. |

(56) References Cited

U.S. PATENT DOCUMENTS

| | | |
|---|---|---|
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0026540 A1 | 2/2007 | Nooten et al. |
| 2007/0032047 A1 | 2/2007 | Hasebe et al. |
| 2007/0048455 A1 | 3/2007 | Koh et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0116887 A1 | 5/2007 | Faguet |
| 2007/0119370 A1 | 5/2007 | Ma et al. |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0163488 A1 | 7/2007 | Tois et al. |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0243693 A1 | 10/2007 | Nemani et al. |
| 2007/0245959 A1 | 10/2007 | Paterson et al. |
| 2007/0251444 A1 | 11/2007 | Gros-Jean et al. |
| 2007/0259110 A1 | 11/2007 | Mahajani et al. |
| 2007/0281495 A1 | 12/2007 | Mallick et al. |
| 2007/0298585 A1 | 12/2007 | Lubomirsky et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0085610 A1 | 4/2008 | Wang et al. |
| 2008/0087890 A1 | 4/2008 | Ahn et al. |
| 2008/0119098 A1 | 5/2008 | Palley et al. |
| 2008/0123394 A1 | 5/2008 | Lee et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0142483 A1 | 6/2008 | Hua et al. |
| 2008/0207007 A1 | 8/2008 | Thridandam et al. |
| 2008/0213479 A1 | 9/2008 | Chou et al. |
| 2008/0233762 A1 | 9/2008 | Hong |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0001510 A1 | 1/2009 | Matz et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2009/0286381 A1 | 11/2009 | van Schravendijk et al. |
| 2009/0286402 A1 | 11/2009 | Xia et al. |
| 2010/0022078 A1 | 1/2010 | Rockenberger et al. |
| 2010/0022099 A1 | 1/2010 | Van Nooten et al. |
| 2010/0025824 A1 | 2/2010 | Chen et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096687 A1 | 4/2010 | Balseanu et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0144162 A1 | 6/2010 | Lee et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0244114 A1 | 9/2010 | Konno et al. |
| 2010/0255218 A1 | 10/2010 | Oka et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0008972 A1 | 1/2011 | Damjanovic et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0121354 A1 | 5/2011 | Schmid et al. |
| 2011/0124187 A1 | 5/2011 | Afzali-Ardakani et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0159673 A1 | 6/2011 | Hanawa et al. |
| 2011/0171775 A1* | 7/2011 | Yamamoto ........ H01L 21/02126 438/99 |
| 2011/0176967 A1 | 7/2011 | Okuda et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0074844 A1 | 3/2012 | York et al. |
| 2012/0077349 A1 | 3/2012 | Li et al. |
| 2012/0086048 A1 | 4/2012 | Park et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0043512 A1 | 2/2013 | Huang et al. |
| 2013/0058161 A1 | 3/2013 | Yamanaka et al. |
| 2013/0058162 A1 | 3/2013 | Yamanaka et al. |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |
| 2013/0323923 A1 | 12/2013 | Koehler et al. |
| 2013/0344248 A1 | 12/2013 | Clark |

(56) References Cited

U.S. PATENT DOCUMENTS

| | | |
|---|---|---|
| 2014/0030444 A1 | 1/2014 | Swaminathan et al. |
| 2014/0051262 A9 | 2/2014 | Lavoie et al. |
| 2014/0065842 A1 | 3/2014 | Anthis et al. |
| 2014/0087066 A1 | 3/2014 | Wang et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0262038 A1 | 9/2014 | Wang et al. |
| 2014/0264555 A1 | 9/2014 | Ahn et al. |
| 2014/0273428 A1 | 9/2014 | Shero et al. |
| 2014/0295084 A1 | 10/2014 | Shirai et al. |
| 2014/0302686 A1 | 10/2014 | Pan et al. |
| 2014/0356549 A1 | 12/2014 | Varadarajan |
| 2015/0041867 A1 | 2/2015 | Han |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0249013 A1 | 9/2015 | Arghavani et al. |
| 2015/0294905 A1 | 10/2015 | Wu et al. |
| 2016/0020092 A1 | 1/2016 | Kang et al. |
| 2016/0064211 A1 | 3/2016 | Swaminathan et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0163539 A9 | 6/2016 | Kang et al. |
| 2016/0163972 A1 | 6/2016 | Swaminathan et al. |
| 2016/0240428 A1 | 8/2016 | Tung et al. |
| 2016/0251756 A1 | 9/2016 | Lansalot-Matras et al. |
| 2016/0276148 A1 | 9/2016 | Qian et al. |
| 2016/0293398 A1 | 10/2016 | Danek et al. |
| 2016/0293838 A1 | 10/2016 | Swaminathan et al. |
| 2016/0322371 A1 | 11/2016 | Yonemochi |
| 2016/0329206 A1 | 11/2016 | Kumar et al. |
| 2016/0329423 A1 | 11/2016 | Kawahara et al. |
| 2016/0336178 A1 | 11/2016 | Swaminathan et al. |
| 2016/0340782 A1 | 11/2016 | Chandrasekharan et al. |
| 2016/0365425 A1 | 12/2016 | Chen et al. |
| 2016/0379826 A9 | 12/2016 | Arghavani et al. |
| 2017/0009346 A1 | 1/2017 | Kumar et al. |
| 2017/0092735 A1 | 3/2017 | Hashemi et al. |
| 2017/0103891 A1 | 4/2017 | Lee et al. |
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0170026 A1 | 6/2017 | Hudson et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2017/0323786 A1 | 11/2017 | Kang et al. |
| 2018/0005801 A1 | 1/2018 | Singhal et al. |
| 2018/0005814 A1 | 1/2018 | Kumar et al. |
| 2018/0061628 A1 | 3/2018 | Ou et al. |
| 2018/0127592 A1 | 5/2018 | Lei et al. |
| 2018/0138028 A1 | 5/2018 | Henri et al. |
| 2018/0247875 A1 | 8/2018 | Kang et al. |
| 2018/0269061 A1 | 9/2018 | Arghavani et al. |
| 2018/0323057 A1 | 11/2018 | Kumar et al. |
| 2019/0080903 A1 | 3/2019 | Abel et al. |
| 2019/0311897 A1 | 10/2019 | Kang et al. |
| 2019/0378710 A1 | 12/2019 | Qian et al. |
| 2019/0385820 A1 | 12/2019 | Singhal et al. |

FOREIGN PATENT DOCUMENTS

| | | |
|---|---|---|
| CN | 1841676 A | 10/2006 |
| CN | 1926668 A | 3/2007 |
| CN | 101006195 A | 7/2007 |
| CN | 101255548 A | 9/2008 |
| CN | 101328578 A | 12/2008 |
| CN | 101378007 A | 3/2009 |
| CN | 101416293 A | 4/2009 |
| CN | 101535524 A | 9/2009 |
| CN | 101736326 A | 6/2010 |
| CN | 101889331 A | 11/2010 |
| CN | 102005462 A | 4/2011 |
| CN | 102191479 A | 9/2011 |
| CN | 102471885 A | 5/2012 |
| CN | 102687249 A | 9/2012 |
| CN | 102906304 A | 1/2013 |
| CN | 103137864 A | 6/2013 |
| CN | 103928396 A | 7/2014 |
| CN | 105391427 A | 3/2016 |
| CN | 105719954 A | 6/2016 |
| EP | 0 277 766 | 8/1988 |
| EP | 0 541 212 | 5/1993 |
| EP | 1 081 754 A2 | 7/2001 |
| EP | 1 703 552 A2 | 9/2006 |
| EP | 2 278 046 | 1/2011 |
| JP | S48-043472 A | 6/1973 |
| JP | H02-093071 A | 4/1990 |
| JP | H03-011635 | 1/1991 |
| JP | 05-226279 | 9/1993 |
| JP | H06-177120 A | 6/1994 |
| JP | H09-102494 A | 4/1997 |
| JP | H09-219401 A | 8/1997 |
| JP | 10-98032 | 4/1998 |
| JP | H10-189467 A | 7/1998 |
| JP | H11-172439 | 6/1999 |
| JP | 2001-274404 | 10/2001 |
| JP | 2001-338922 A | 12/2001 |
| JP | 2002-009072 | 1/2002 |
| JP | 2002-134497 A | 5/2002 |
| JP | 2002-164345 A | 6/2002 |
| JP | 2002-539640 A | 11/2002 |
| JP | 2005-210076 A | 8/2005 |
| JP | 2005-310927 | 11/2005 |
| JP | 2006-060091 | 3/2006 |
| JP | 2006-303431 A | 11/2006 |
| JP | 2007-165883 | 6/2007 |
| JP | 2007-180362 A | 7/2007 |
| JP | 2007-189173 A | 7/2007 |
| JP | 2007-521658 A | 8/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-060455 A | 3/2008 |
| JP | 2008-109093 A | 5/2008 |
| JP | 2008-517479 | 5/2008 |
| JP | 2008-522405 A | 6/2008 |
| JP | 2008-182199 A | 8/2008 |
| JP | 2008-258591 A | 10/2008 |
| JP | 2008-294260 A | 12/2008 |
| JP | 2008-306093 A | 12/2008 |
| JP | 2009-65203 A | 3/2009 |
| JP | 2009-170823 A | 7/2009 |
| JP | 2009-540128 A | 11/2009 |
| JP | 4364320 B2 | 11/2009 |
| JP | 2010-10497 A | 1/2010 |
| JP | 2010-043081 A | 2/2010 |
| JP | 2010-103484 A | 5/2010 |
| JP | 2010-118664 A | 5/2010 |
| JP | 2010-152136 | 7/2010 |
| JP | 2010-183069 A | 8/2010 |
| JP | 2010-530127 | 9/2010 |
| JP | 2010-245518 A | 10/2010 |
| JP | 2010-251654 A | 11/2010 |

(56) References Cited

FOREIGN PATENT DOCUMENTS

| | | |
|---|---|---|
| JP | 2010-283388 A | 12/2010 |
| JP | 2010-539730 A | 12/2010 |
| JP | 2011-023576 A | 2/2011 |
| JP | 2011-023655 A | 2/2011 |
| JP | 2011-054968 A | 3/2011 |
| JP | 11-067744 | 4/2011 |
| JP | 2011-187934 A | 9/2011 |
| JP | 2012-506640 A | 3/2012 |
| JP | 2012-199306 | 10/2012 |
| JP | 2013-102130 A | 5/2013 |
| JP | 2013-166965 A | 8/2013 |
| JP | 2013-196822 A | 9/2013 |
| JP | 2013-225655 A | 10/2013 |
| JP | 2013-240042 A | 11/2013 |
| JP | 2014-532304 A | 12/2014 |
| KR | 2001-0111448 | 12/2001 |
| KR | 0356473 B1 | 10/2002 |
| KR | 2004-0001036 | 1/2004 |
| KR | 2006-0056883 | 5/2006 |
| KR | 0721503 B1 | 5/2007 |
| KR | 2007-0060104 | 6/2007 |
| KR | 0734748 B | 7/2007 |
| KR | 2008-0052499 | 6/2008 |
| KR | 2009-0057665 | 6/2009 |
| KR | 2009-0080019 | 7/2009 |
| KR | 2009-0081396 | 7/2009 |
| KR | 2009-0116433 | 11/2009 |
| KR | 2010-0133377 | 12/2010 |
| KR | 2011-0016916 | 2/2011 |
| KR | 2011-0086090 | 7/2011 |
| KR | 2013-0056608 | 5/2013 |
| KR | 2015-0025224 | 3/2015 |
| SG | 188537 A1 | 4/2013 |
| TW | 483103 B | 4/2002 |
| TW | 200701341 | 1/2007 |
| TW | 2007/21306 | 6/2007 |
| TW | 201009942 A | 3/2010 |
| TW | 201042706 A1 | 12/2010 |
| TW | 2011/13934 A1 | 4/2011 |
| TW | 201140695 A1 | 11/2011 |
| TW | 201144475 A1 | 12/2011 |
| WO | WO 2004/032196 | 4/2004 |
| WO | WO 2006/014471 | 2/2006 |
| WO | WO 2006/018441 | 2/2006 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/087580 | 7/2011 |
| WO | WO 2011/087850 | 7/2011 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/095396 | 6/2013 |
| WO | WO 2013/112727 | 8/2013 |

OTHER PUBLICATIONS

U.S. Final Office Action dated Sep. 13, 2013 issued in U.S. Appl. No. 13/084,399.
U.S Notice of Allowance dated Jan. 15, 2014 issued in U.S. Appl. No. 13/084,399.
U.S. Office Action dated Jan. 2, 2015 issued in U.S. Appl. No. 14/231,554.
U.S. Final Office Action dated Jun. 10, 2015 issued in U.S. Appl. No. 14/231,554.
U.S. Notice of Allowance dated Aug. 31, 2015 issued in U.S. Appl. No. 14/231,554.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Apr. 13, 2011 issued in U.S. Appl. No. 12/889,132.
U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Jul. 1, 2016 issued in U.S. Appl. No. 13/963,212.
U.S. Office Action dated Jan. 12, 2017 issued in U.S. Appl. No. 13/963,212.
U.S. Final Office Action dated Jun. 28, 2017 issued in U.S. Appl. No. 13/963,212.
U.S. Office Action dated Jan. 24, 2018 issued in U.S. Appl. No. 13/963,212.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Office Action dated Sep. 21, 2015 issued U.S. Appl. No. 14/607,997.
U.S. Final Office Action dated Mar. 18, 2016 issued U.S. Appl. No. 14/607,997.
U.S. Notice of Allowance dated Jun. 16, 2016 issued U.S. Appl. No. 14/607,997.
U.S. Notice of Allowance dated Sep. 27, 2016 issued U.S. Appl. No. 14/607,997.
U.S. Office Action dated Sep. 26, 2017 issued in U.S. Appl. No. 15/426,889.
U.S. Notice of Allowance dated Mar. 28, 2018 issued in U.S. Appl. No. 15/426,889.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.
U.S. Examiner's Answer to Appeal Brief (filed May 22, 2014) Before the Patent Trial and Appeal Board dated Aug. 14, 2014 issued U.S. Appl. No. 13/224,240.
U.S. Patent Board Decision on Appeal Before the Patent Trial and Appeal Board (Examiner Affirmed) dated Aug. 11, 2016 issued U.S. Appl. No. 13/224,240.
U.S. Notice of Allowance dated Nov. 17, 2016 issued U.S. Appl. No. 13/224,240.
U.S. Notice of Allowance (Supplemental Notice of Allowability) dated Feb. 21, 2017 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.

(56) References Cited

OTHER PUBLICATIONS

U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated Dec. 24, 2015 issued in U.S. Appl. No. 14/074,596.
U.S. Notice of Allowance dated Feb. 12, 2016 issued in U.S. Appl. No. 14/074,596.
U.S. Office Action dated May 15, 2015 issued in U.S. Appl. No. 14/074,617.
U.S. Notice of Allowance dated Nov. 20, 2015 issued in U.S. Appl. No. 14/074,617.
U.S. Office Action dated Dec. 30, 2016 issued in U.S. Appl. No. 15/015,952.
U.S. Notice of Allowance dated Jun. 15, 2017 issued in U.S. Appl. No. 15/015,952.
U.S. Notice of Allowance dated Jan. 29, 2018 issued in U.S. Appl. No. 15/650,662.
U.S. Office Action dated Oct. 1, 2019 issued in U.S. Appl. No. 15/965,628.
U.S. Notice of Allowance dated Mar. 30, 2020 issued in U.S. Appl. No. 15/965,628.
U.S. Office Action dated Aug. 14, 2015 issued in U.S. Appl. No. 14/061,587.
U.S. Notice of Allowance dated Feb. 11, 2016 issued in U.S. Appl. No. 14/061,587.
U.S. Notice of Allowance [Supplemental Notice of Allowability] dated Mar. 1, 2016 issued in U.S. Appl. No. 14/061,587.
U.S. Office Action dated Mar. 2, 2015 issued in U.S. Appl. No. 14/137,860.
U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Feb. 3, 2017 issued in U.S. Appl. No. 14/987,542.
U.S. Notice of Allowance dated Jun. 20, 2017 issued in U.S. Appl. No. 14/987,542.
U.S. Notice of Allowance dated Aug. 22, 2017 issued in U.S. Appl. No. 14/987,542.
U.S. Office Action dated Nov. 9, 2018 issued in U.S. Appl. No. 15/654,186.
U.S. Notice of Allowance dated Mar. 7, 2019 issued in U.S. Appl. No. 15/654,186.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Final Office Action dated Nov. 1, 2016 issued in U.S. Appl. No. 14/194,549.
U.S. Office Action dated Apr. 19, 2017 issued in U.S. Appl. No. 14/194,549.
U.S. Final Office Action dated Sep. 20, 2017 issued in U.S. Appl. No. 14/194,549.
U.S. Notice of Allowance dated Feb. 14, 2018 issued in U.S. Appl. No. 14/194,549.
U.S. Office Action dated Mar. 21, 2019 issued in U.S. Appl. No. 15/976,793.
U.S. Notice of Allowance dated Oct. 3, 2019 issued in U.S. Appl. No. 15/976,793.
U.S. Notice of Allowance dated Aug. 5, 2015 issued in U.S. Appl. No. 14/183,287.
U.S. Office Action dated Aug. 1, 2016 issued in U.S. Appl. No. 14/932,869.
U.S. Office Action dated Jul. 2, 2015 issued in U.S. Appl. No. 14/187,145.
U.S. Final Office Action dated Dec. 16, 2015 issued in U.S. Appl. No. 14/187,145.
U.S. Notice of Allowance dated Feb. 25, 2016 issued in U.S. Appl. No. 14/187,145.
U.S. Office Action dated Jun. 9, 2017 issued in U.S. Appl. No. 15/224,347.
U.S. Notice of Allowance dated Oct. 4, 2017 issued in U.S. Appl. No. 15/224,347.
U.S. Notice of Allowance [Corrected Notice of Allowability] dated Nov. 28, 2017 issued in U.S. Appl. No. 15/224,347.
U.S. Office Action dated Jun. 14, 2016 issued in U.S. Appl. No. 15/019,904.
U.S. Notice of Allowance dated Oct. 13, 2016 issued in U.S. Appl. No. 15/019,904.
U.S. Office Action dated Nov. 25, 2016 issued in U.S. Appl. No. 15/178,474.
U.S. Notice of Allowance dated Feb. 10, 2017 issued in U.S. Appl. No. 15/178,474.
U.S. Notice of Allowance dated Mar. 27, 2017 issued in U.S. Appl. No. 15/178,474.
U.S. Notice of Allowance dated Apr. 18, 2017 issued in U.S. Appl. No. 15/178,474.
U.S. Office Action dated Aug. 22, 2017 issued in U.S. Appl. No. 15/609,864.
U.S. Final Office Action dated Dec. 4, 2017 issued in U.S. Appl. No. 15/609,864.
U.S. Notice of Allowance dated Mar. 9, 2018 issued in U.S. Appl. No. 15/609,864.
U.S. Office Action dated Apr. 13, 2015 issued in U.S. Appl. No. 14/335,785.
U.S. Final Office Action dated Aug. 24, 2016 issued in U.S. Appl. No. 14/335,785.
U.S. Notice of Allowance dated Nov. 4, 2016 issued in U.S. Appl. No. 14/335,785.
U.S. Notice of Allowance dated Feb. 22, 2017 issued in U.S. Appl. No. 14/335,785.
U.S. Notice of Allowance dated Mar. 21, 2017 issued in U.S. Appl. No. 14/335,785.
U.S. Notice of Allowance [Corrected Notice of Allowability] dated Apr. 19, 2017 issued in U.S. Appl. No. 14/335,785.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Office Action dated Jul. 30, 2019 issued in U.S. Appl. No. 15/847,744.
U.S. Final Office Action dated Jan. 21, 2020 issued in U.S. Appl. No. 15/847,744.
U.S. Notice of Allowance dated May 28, 2020 issued in U.S. Appl. No. 15/847,744.
U.S. Notice of Allowance dated Jul. 15, 2016 issued in U.S. Appl. No. 14/678,736.
U.S. Office Action dated Aug. 18, 2017 issued in U.S. Appl. No. 15/201,221.
U.S. Notice of Allowance dated Apr. 9, 2018 issued in U.S. Appl. No. 15/201,221.
U.S. Office Action dated Mar. 21, 2019 issued in U.S. Appl. No. 16/034,022.
U.S. Final Office Action dated Sep. 27, 2019 issued in U.S. Appl. No. 16/034,022.
Notice of Allowance dated Feb. 7, 2020 issued in U.S. Appl. No. 16/034,022.
U.S. Office Action dated Oct. 6, 2017 issued in U.S. Appl. No. 15/253,301.
U.S. Notice of Allowance dated Mar. 26, 2018 issued in U.S. Appl. No. 15/253,301.

(56) References Cited

OTHER PUBLICATIONS

U.S. Office Action dated Jan. 26, 2018 issued in U.S. Appl. No. 15/683,397.
U.S. Final Office Action dated Nov. 16, 2018 issued in U.S. Appl. No. 15/683,397.
U.S. Notice of Allowance dated Mar. 28, 2019 issued in U.S. Appl. No. 15/683,397.
U.S. Office Action dated Feb. 14, 2020 issued in U.S. Appl. No. 16/453,237.
U.S. Final Office Action dated Aug. 20, 2020 issued in U.S. Appl. No. 16/453,237.
U.S. Office Action dated Jul. 18, 2018 issued in U.S. Appl. No. 15/703,917.
U.S. Notice of Allowance dated Dec. 5, 2018 issued in U.S. Appl. No. 15/703,917.
PCT International Search Report and Written Opinion, dated Oct. 20, 2011, issued in Application No. PCT/US2011/032186.
PCT International Preliminary Report on Patentability, dated Oct. 26, 2012,. issued in Application No. PCT/US2011/032186.
Korean Office Action, dated Feb. 7, 2017, issued in Application No. KR 10-2012-7004925.
Korean Office Action, dated Aug. 23, 2017, issued in Application No. KR 10-2017-7020548.
Taiwan Office Action dated Apr. 27, 2016 issued in Application No. TW 100113041.
PCT Invitation to Pay Additional Fees; Communication Re Partial International. Search, dated Dec. 16, 2011, issued in Application No. PCT/US2011/032303.
PCT International Search Report and Written Opinion, dated Feb. 20, 2012, issued in PCT/US2011/032303.
PCT International Preliminary Report on Patentability and Written Opinion, dated. Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated. Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Korean Office Action, dated May 23, 2017, issued in Application No. KR 10-2013-7010291.
Korean Office Action, dated Nov. 27, 2017, issued in Application No. KR 10-2013-7010291.
Korean Decision for Grant of Patent, dated Jul. 25, 2018, issued in Application No. KR 10-2013-7010291.
Taiwan Office Action dated May 5, 2016 issued in Application No. TW 100134208.
Taiwan Office Action dated Oct. 19, 2017 issued in Application No. TW 105130207.
PCT International Search Report and Written Opinion dated Dec. 18, 2012, issued in Application No. PCT/US2012/052769.
PCT International Preliminary Report on Patentability and Written Opinion dated. Apr. 3, 2014, issued in Application No. PCT/US2012/052769.
Chinese First Office Action dated Nov. 19, 2015 issued in Application No. CN 201280046487.6.
Chinese Second Office Action dated Aug. 22, 2016 issued in Application No. CN 201280046487.6.
Chinese First Office Action dated Jan. 20, 2020 issued in Application No. CN 201710347032.2.
Chinese Second Office Action dated Aug. 14, 2020 issued in Application No. CN 201710347032.2.
Japanese Office Action dated Aug. 23, 2016 issued in Application No. JP 2014-531838.
Korean First Office Action dated Oct. 2, 2018 issued in Application No. KR 102014-7010949.
Korean First Office Action dated Aug. 19, 2019 issued in Application No. KR 10-2019-7012231.
Singapore Supplementary Examination Report dated Jun. 1, 2016 issued in Application No. SG 11201400633R.
Singapore Search Report and Written Opinion dated May 19, 2020 issued in Application No. SG 10201607194P.
Taiwan Notice of Allowance and Search Report dated Dec. 18, 2015 issued in Application No. TW 101134692.
Taiwan First Office Action dated Mar. 14, 2018 issued in Application No. TW 106122777.
Taiwan Second Office Action dated Dec. 14, 2018 issued in Application No. TW 106122777.
Japanese Notice of Reason for Refusal dated Jul. 24, 2018 issued in Application No. JP 2017-159931.
Japanese Second Office Action dated Jun. 17, 2019 issued in Application No. JP 2017-159931.
Japanese Third Office Action dated Mar. 10, 2020 issued in Application No. JP 2017-159931.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Chinese Second Office Action dated Aug. 16, 2016 issued in Application No. CN 201280053888.4.
Korean First Office Action dated Oct. 31, 2017 issued in Application No. KR 10-2014-7008696.
Korean Second Office Action dated Sep. 20, 2018 issued in Application No. KR 10-2014-7008696.
Korean Decision for Grant of Patent, dated May 17, 2019 issued in Application No. KR 10-2014-7008696.
Taiwan Office Action and Search Report dated Jan. 27, 2016 issued in Application No. TW 101131556.
Taiwan Office Action and Search Report dated Nov. 9, 2016 issued in Application No. TW 101131556.
Chinese First Office Action dated May 19, 2016 issued in Application No. CN 201310021460.8.
Chinese Second Office Action dated Apr. 13, 2017 issued in Application No. CN 201310021460.8.
Chinese Third Office Action dated Oct. 17, 2017 issued in Application No. CN 201310021460.8.
Chinese Fourt Office Action dated May 16, 2018 issued in Application No. CN 201310021460.8.
Chinese Notification of Reexamination dated Apr. 17, 2020 issued in Application No. CN 201310021460.8.
European Extended Search Report dated Apr. 14, 2014 issued in Application No. EP 13 15 2046.
European Examination Report dated Dec. 11, 2017 issued in Application No. EP 13 15 2046.
Japanese Office Action dated Jan. 10, 2017 issued in Application No. JP 2013-007612.
Japanese Decision of Rejection dated Jan. 9, 2018 issued in Application No. JP 2013-007612.
Japanese Reason for Refusal dated Apr. 2, 2019 issued in Application No. JP 2013-007612.
Japanese First Office Action dated May 29, 2019 issued in Application No. JP 2018-090402.
Japanese Second Office Action [Decision of Rejection] dated Jan. 14, 2020 issued in Application No. JP 2018-090402.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO (description) dated May 26, 2015 issued in Application No. KR 10-2012-0043797.
Taiwan Examination Report dated Mar. 29, 2017 issued in Application No. TW 102102054.
PCT International Search Report and Written Opinion dated May 27, 2013, issued in Application No. PCT/US2013/022977.
PCT International Preliminary Report on Patentability and Written Opinion dated. Aug. 7, 2014, issued in Application No. PCT/US2013/022977.

(56) References Cited

OTHER PUBLICATIONS

Chinese First Office Action dated Feb. 22, 2016 issued in Application No. CN 201380006994.1.
Chinese Second Office Action dated Feb. 6, 2017 issued in Application No. CN 201380006994.1.
Japanese Notification of Reasons for Rejection dated Jan. 10, 2017 issued in Application No. JP2014-554825.
Japanese Decision of Refusal dated Dec. 5, 2017 issued in Application No. JP2014-554825.
Singapore Supplementary Examination Report dated Aug. 11, 2016 issued in Application No. SG 11201404315R.
Taiwan Office Action and Search Report dated Jul. 20, 2016 issued in Application No. TW 102102879.
Taiwan Office Action dated Oct. 25, 2016 issued in Application No. TW 102117772.
Taiwan Rejection Decision dated Aug. 17, 2017 issued in Application No. TW 102117772.
Korean First Office Action dated Jun. 28, 2019 issued in Application No. KR 10-2013-0056776.
Japanese First Office Action dated Oct. 31, 2017 issued in Application No. JP 2013-230782.
Japanese Second Office Action dated May 22, 2018 issued in Application No. JP 2013-230782.
Japanese Decision to Grant dated Sep. 10, 2018 issued in Application No. JP 2013-230782.
Korean First Office Action dated May 14, 2020 issued in Application No. KR 10-2013-0135905.
Japanese Office Action dated Dec. 5, 2017 issued in Application No. JP 2013-231188.
Japanese Second Office Action [*Decision of Rejection*] dated Dec. 4, 2018 issued in Application No. JP 2013-231188.
Korean First Office Action dated Jan. 15, 2020 issued in Application No. KR 10-2013-0135907.
Taiwan Examination Report dated Jul. 13, 2017 issued in Application No. TW 102140721.
Taiwan First Office Action dated Sep. 20, 2018 issued in Application No. TW 106140906.
Korean First Office Action dated May 27, 2020 issued in Application No. KR 10-2013-0126834.
Taiwan Examination Report dated Jan. 11, 2017 issued in Application No. TW 102138326.
Chinese First Office Action dated Nov. 28, 2016 issued in Application No. CN 201410521390.7.
Taiwan First Office Action dated May 3, 2018 issued in Application No. TW 103133765.
Chinese First Office Action dated Jul. 10, 2020 issued in Application No. CN 201710839679.7.
Japanese First Office Action dated Dec. 18, 2018 issued in Application No. JP 2014-262248.
Singapore Eligibility to Grant w/Supplemental Examinatinon Report dated Apr. 23, 2019 issued in Application No. SG 10201408801Q.
Taiwan First Office Action dated Jun. 26, 2018 issued in Application No. TW 103145386.
Chinese First Office Action dated May 27, 2017 issued in Application No. CN 201510091775.9.
Chinese Second Office Action dated Mar. 26, 2018 issued in Application No. CN 201510091775.9.
Chinese Third Office Action dated Oct. 15, 2018 issued in Application No. CN 201510091775.9.
Chinese Fourth Office Action dated Mar. 27, 2019 issued in Application No. CN 201510091775.9.
Chinese Fifth Office Action dated Jun. 30, 2020 issued in Application No. CN 201510091775.9.
Taiwanese First Office Action dated Sep. 14, 2018 issued in Application No. TW 104106165.
Chinese First Office Action dated Apr. 11, 2016 issued in Application No. CN 201510086588.1.
Chinese Second Office Action dated Mar. 20, 2017 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.
Taiwan Notice of Allowance and Search Report dated Aug. 30, 2018 issued in Application No. TW 104104471.
Singapore Search Report and Written Opinion dated Mar. 14, 2019 issued in Application No. SG 10201807090Q.
Singapore Second Written Opinion dated Jan. 24, 2020 issued in Application No. SG 10201807090Q.
Taiwan First Office Action dated Sep. 13, 2018, issued in Application No. TW 104104648.
Taiwan Notice of Allowance dated Jul. 2, 2020, issued in Application No. TW 108119661.
Chinese Third Office Action dated Dec. 22, 2017, issued in Application No. CN 201380006994.1.
Taiwanese First Office Action dated Nov. 9, 2018 issued in Application No. TW 104122669.
Chinese First Office Action dated Mar. 30, 2018 issued in Application No. CN 201610206201.6.
Chinese Second Office Action dated Jan. 24, 2019 issued in Application No. CN 201610206201.6.
Taiwan First Office Action dated Oct. 16, 2019 issued in Application No. TW 105109955.
Chinese First Office Action dated Oct. 8, 2018 issued in Application No. CN 201710522311.8.
Chinese Second Office Action dated Jun. 13, 2019 issued in Application No. CN 201710522311.8.
PCT International Search Report and Written Opinion dated Feb. 25, 2019 issued in Application No. PCT/US2018/050049.
PCT International Preliminary Report on Patentability dated Mar. 26, 2020 issued in Application No. PCT/US2018/050049.
Cecchi et al., (2007) "Ultra-thin conformal pore-sealing of low-k materials by plasma-assisted ALD," *University of New Mexico*, Albuquerque, NM, Sandia National Labs, Albuquerque, NM, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Faraz et al., (2015) "Atomic Layer Etching: What Can We Learn from Atomic Layer Deposition?," *ECS Journal of Solid State Science and Technology*, 4(6):N5023-N5032.
Hausmann et al., (2002) "Atomic Layer Deposition of Hafnium and Zirconium Oxides Using Metal Amide Precursors," *Chem. Mater.* 14(10):4350-4358.
Elam et al.,(2003) "Growth of ZnO/Al2O3 Alloy Films Using Atomic Layer Deposition Techniques," Chemistry of Materials, 2003, vol. 15, No. 4, pp. 1020-1028. <doi:10.1021/cm020607+>.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.

(56) References Cited

OTHER PUBLICATIONS

Lee, Jong Ju, (2005) "Low-impurity, highly conformal atomic layer deposition of titanium nitride using $NH_3$-Ar-$H_2$ plasma treatment for capacitor electrodes," *Materials Letters*, 59:615-617.

Li, Xingcun, et al., (2011) "Atomic Layer Deposition $Al_2O3$ Thin Films in Magnetized Radio Frequency Plasma Source," *Physics Procedia* 18:100-106.

Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.

Nguyen, S.V. et al., (Jan./Mar. 1999) "Plasma-assist chemical vapor deposition of dielectric thin films for ULSI semiconductor circuits," *IBM J.Res.Develop*. 43(1.2):5-38.

Plasma Enhanced Atomic Layer Deposition (PEALD), Website: http://www.asm.com/index.php?option=com_content&task=view&id=19&Itemid=161 (2010), 1 page.

"PlasmaPro™ NGP® 80 Range," *Oxford Instruments* (2010), 8 pages.

Pritchett, Merry, (May 2004) "Adherence/Diffusion Barrier Layers for Copper Metallization: Amorphous Carbon:Silicon Polymerized Films," Dissertation Prepared for the Degree of Doctor of Philosophy, *University of Texas*, 113pp.

Puurunen, Riikka L. (2005) "Surface chemistry of atomic layer deposition: A case study for the trimethylaluminum/water process," *Journal of Applied Physics*, 97:121301-1-121301-52.

Van der Straten et al., (2004) "Atomic layer deposition of tantalum nitride for ultrathin liner applications in advanced copper metallization schemes," *Journal of Materials Research*, 19(2):447-453.

U.S. Office Action dated Aug. 7, 2020 issued in U.S. Appl. No. 16/457,635.

Hiller, D., et al., "Low temperature silicon dioxide by thermal atomic layer deposition: investigation of material properties". Journal of Applied Physics 107, 064314 (2010), pp. 1-10.

Mallikarjunan, Anupama, et al., "Designing high performance precursors for atomic layer deposition of silicon oxide". Journal of Vacuum Science & Technology A 33(1), 01A137 (2015), pp. 1-4. https://doi.org/10.1116/1.4903275.

Kim, Dae Hyun, et al., "Thermal Atomic Layer Deposition of Device-Quality Si02 Thin Films under 100° C. Using an Aminodisilane Precursor". Chem. Mater. 2019, 31, 5502-5508.

Pena, Luis Fabian, et al., "Atomic Layer Deposition of Silicon Dioxide Using Aminosilanes Disec-butylaminosilane and Bis(tert-butylamino)silane with Ozone". J. Phys. Chem. C 2016, 120, 10927-10935.

Arl, D., et al., "SiO2 thin film growth through a pure atomic layer deposition technique at room temperature". RSC Adv., 2020, 10, 18073-18081.

U.S. Appl. No. 16/036,784, filed Jul. 16, 2018, Ou et al.

* cited by examiner

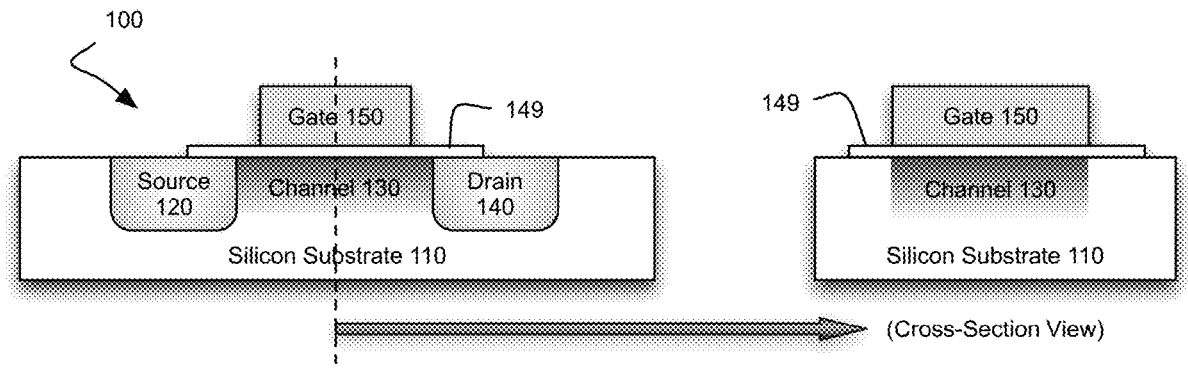
Fig. 1A
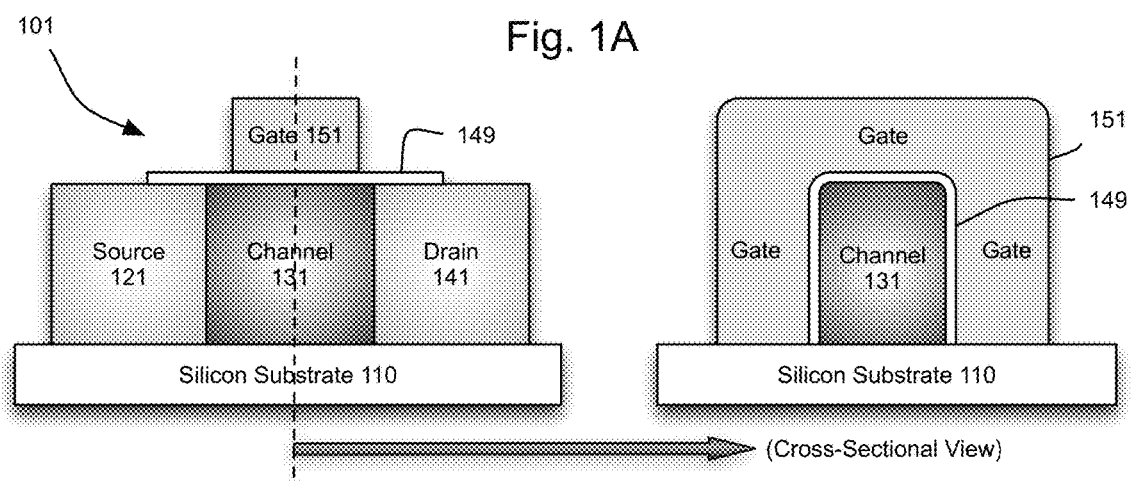
Fig. 1B
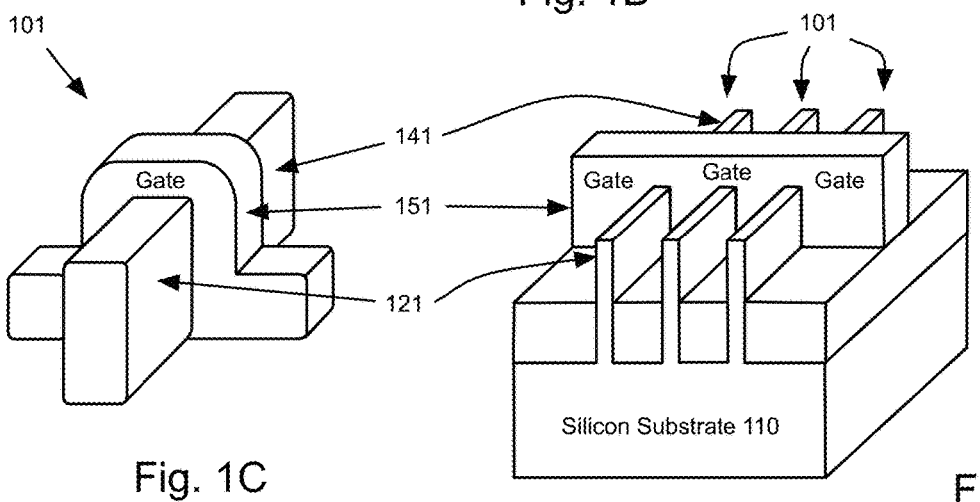
Fig. 1C
Fig. 1D (Cross-Sectional View)

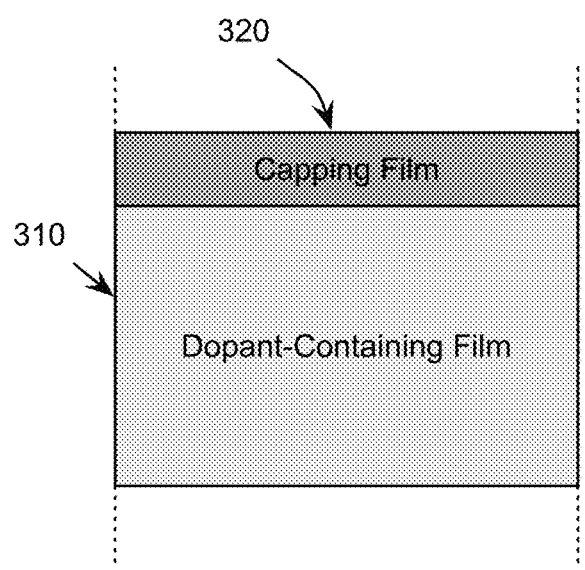
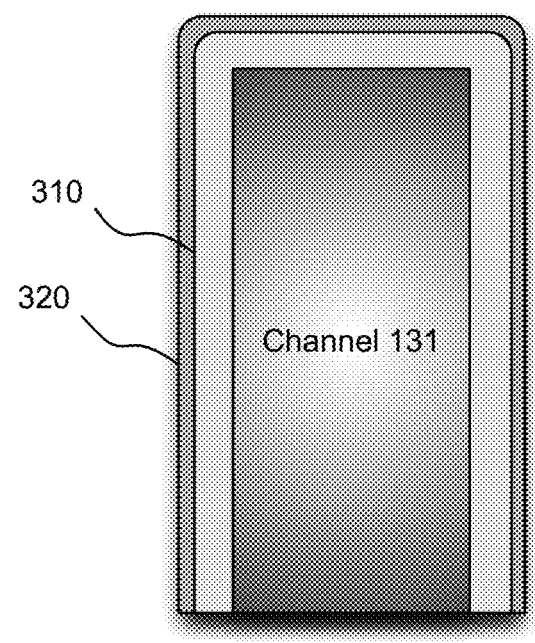
Fig. 3A
Fig. 3B

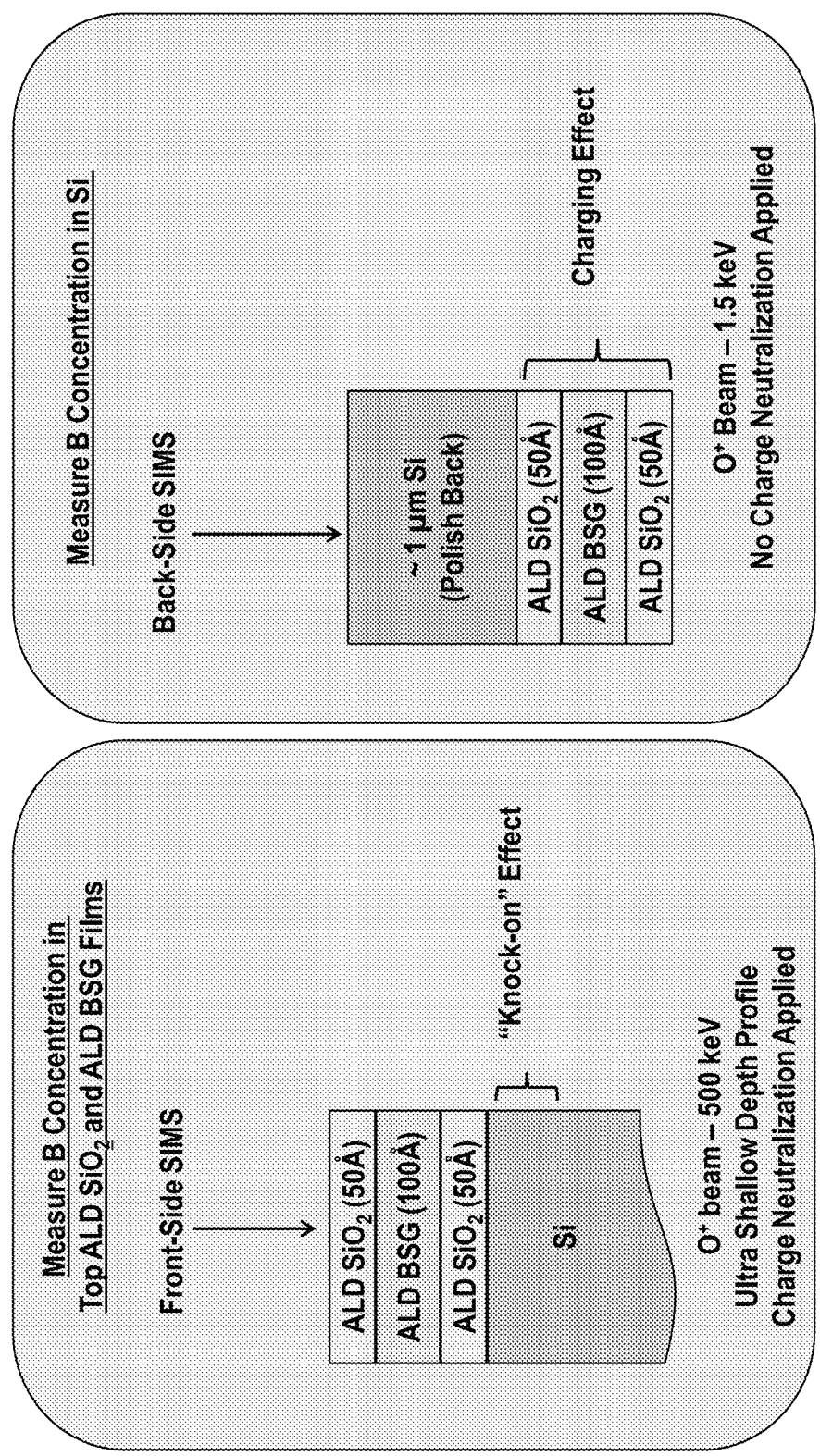

CAPPED ALD FILMS FOR DOPING FIN-SHAPED CHANNEL REGIONS OF 3-D IC TRANSISTORS

CROSS-REFERENCE TO RELATED APPLICATION

An Application Data Sheet is filed concurrently with this specification as part of the present application. Each application that the present application claims benefit of or priority to as identified in the concurrently filed Application Data Sheet is incorporated by reference herein in their entireties and for all purposes.

BRIEF DESCRIPTION OF THE DRAWINGS

FIG. 1A displays a side view schematic of a traditional planar IC transistor.

FIG. 1B displays a cross-sectional view schematic of a traditional planar IC transistor.

FIG. 1C displays a perspective view schematic of a modern tri-gate IC transistor employing a fin-shaped channel region.

FIG. 1D displays another perspective view schematic of a modern tri-gate IC transistor employing a fin-shaped channel region.

FIG. 3A schematically illustrates a dopant-containing film having a capping film.

FIG. 3B schematically illustrates the dopant-containing film of FIG. 3A disposed on a fin-shaped channel region for doping the channel region.

FIGS. 4A and 4B display schematics of a dopant-containing borosilicate glass (BSG) films sandwiched between silicon dioxide ($SiO_2$) layers which are used to demonstrate boron dopant diffusion through $SiO_2$ layers via the SIMS experiments shown in FIG. 4C.

BACKGROUND

Figure 2A:
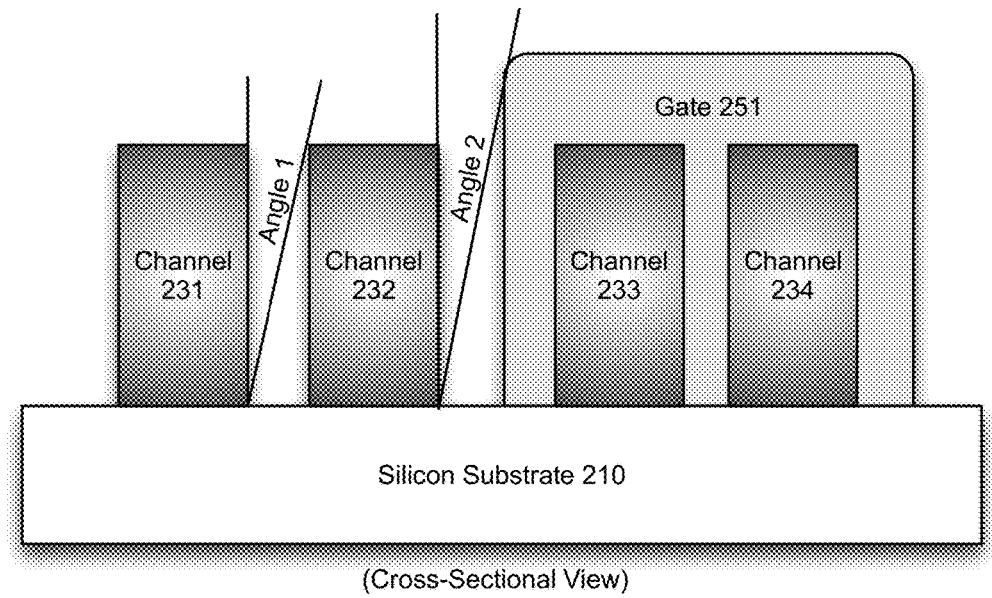
FIG. 2A schematically illustrates the shadowing effect which may occur when attempting to dope the channel region of high aspect ratio fin-shaped structures via conventional ion-implantation techniques. This figure illustrates the scenario where the shadowing effect of an adjacent fin structure is increased due to the presence of deposited gate electrode material.

Traditionally, integrated circuit (IC) transistors have employed a planar design wherein components of the transistor—source, drain, and channel—are formed in the surface of the semiconductor substrate, and the gate component is formed as a flat structure atop the channel region of the substrate's surface. More recently, however, the desire for smaller and smaller device sizes has motivated the development of so-called 3-D transistors wherein source, drain, and channel are formed in fin-shaped structures which extend vertically from the substrate surface, generally with a high aspect ratio. With the channel formed in these vertical fin structures, the gate component of a 3-D transistor can be made to wrap around the channel region, substantially increasing the surface area of the channel region relative to its volue exposed directly to the gate voltage.

The structural differences between planar and 3-D transistors is schematically illustrated in FIGS. 1A and 1B. FIG. 1A schematically illustrates a traditional planar IC transistor 100. On the left in the figure is a side view showing source 120, channel 130, and drain 140 formed in a silicon substrate 110, with gate 150 sitting atop channel 130 separated by gate dielectric 149. To the right in the figure is a cross-sectional view of the same transistor 100 taken from the point-of-view of the vertical dotted line (as indicated by the horizontal arrow). From both views, it is seen that gate 150 is only located adjacent to one side of channel 130 (separated by gate dielectric 149). FIG. 1B provides a simplified illustration of a modern 3-D transistor design 101 with side view (left) and cross-sectional view (right) similar to that shown in FIG. 1A for the planar transistor 100. It is seen from the side view that source 121, channel 131, and drain 141 extend vertically from the plane of the silicon substrate 110 (unlike planar transistor 100). However, the cross-sectional view in FIG. 1B (right) shows that gate 151 of 3-D transistor 101 is able to wrap around the channel region 131 from three sides (in contrast to the arrangement of the gate 150 in planar transistor 100). This wrapping of the gate around the vertical fin structure is further illustrated in FIG. 1C (again showing 3-D transistor 101 with source 121, drain 141, and gate 151, although channel 131 is obscured by the gate); and FIG. 1D illustrates how multiple 3-D transistors 101 formed from parallel vertical fin structures may be wrapped by a 3-D gate component 151. This fundamental shift in transistor architecture from planar to 3-D designs has created challenges for IC fabrication, and to optimally address these challenges new fabrication techniques must be developed.

SUMMARY

Disclosed herein are methods of doping a fin-shaped channel region of a partially fabricated 3-D transistor on a semiconductor substrate. In some embodiments, the methods include forming a dopant-containing film on the substrate, forming a capping film located such that the dopant-containing film is located in between the substrate and the capping film, and driving dopant from the dopant-containing film into the fin-shaped channel region. In certain such embodiments, the capping film includes a silicon carbide material, a silicon nitride material, a silicon carbonitride material, or a combination thereof. In certain such embodiments, multiple dopant-containing layers of the dopant-containing film are formed by an atomic layer deposition process which includes adsorbing a dopant-containing film precursor onto the substrate such that the precursor forms an adsorption-limited layer, removing at least some unadsorbed dopant-containing film precursor from the volume surrounding the adsorbed precursor, reacting adsorbed dopant-containing film precursor to form a dopant-containing layer on the substrate, removing desorbed dopant-containing film precursor and/or reaction by-product from the volume surrounding the dopant-containing layer when present after reacting the adsorbed precursor, and repeating this process sequence to form multiple dopant-containing layers of the dopant-containing film.

Also disclosed herein are dopant-containing films for doping the fin-shaped channel region of a partially fabricated 3-D transistor on a semiconductor substrate. In some embodiments, the films may include first and second dopant-rich portions, first and second substantially dopant-free portions, and a capping film including a silicon carbide material, a silicon nitride material, a silicon carbonitride material, or a combination thereof. In certain such embodiments, the first dopant-rich portion of the film may be formed by conformally depositing multiple dopant-containing layers sequentially, without intervening deposition of a substantially dopant-free layer, and the second dopant rich portion may also be formed by conformally depositing multiple dopant-containing layers sequentially, without intervening deposition of a substantially dopant-free layer. Likewise, in certain such embodiments, the first substantially dopant-free portion of the film may be formed by conformally depositing multiple substantially dopant-free layers sequentially, without intervening deposition of a dopant-containing layer, and the second substantially dopant-free portion of the film may also be formed by conformally depositing multiple substantially dopant-free layers sequentially, without intervening deposition of a dopant-containing layer. In certain such embodiments, the portions of the films may be located such that the first substantially dopant-free portion is located between the first and second dopant-rich portions, the second dopant-rich portion is located between the first and second substantially dopant-free portions, and the layer of capping film is located such that the first and second dopant-rich portions and the first and second substantially dopant-free portions are in between the substrate and the capping film.

Also disclosed herein are multi-station substrate processing apparatuses for doping the fin-shaped channel regions of partially fabricated 3-D transistors on the surfaces of multiple semiconductor substrates. In some embodiments, the apparatuses include a plurality of process stations having a substrate holder contained in one or more processing chambers, one or more valves for controlling flow of dopant-containing film precursor to the process stations, one or more valve-operated vacuum sources for removing dopant-containing film precursor from the volumes surrounding the process stations contained in the one or more processing chambers, and one or more controllers having, and/or having access to, machine-readable instructions for operating the one or more valves and one or more vacuum sources to dope the fin-shaped channel regions on the surfaces of the substrates. In some embodiments, included are instructions for forming a dopant-containing film on a substrate at a process station contained in a processing chamber, instructions for forming a capping film located such that the dopant-containing film is in between the substrate and the capping film, and instructions for driving dopant from the dopant-containing film into a fin-shaped channel region. In certain such embodiments, the capping film includes a silicon carbide material, a silicon nitride material, a silicon carbonitride material, or a combination thereof. In some embodiments, the multiple dopant-containing layers of the film are formed according to the instructions by an atomic layer deposition process including introducing a dopant-containing film precursor into the processing chamber containing the process station having the substrate holder holding the substrate, and allowing the precursor to adsorb onto the surface of the substrate such that the precursor forms an adsorption-limited layer on the substrate, removing unadsorbed dopant-containing film precursor from the volume surrounding the adsorbed precursor, reacting adsorbed dopant-containing film precursor to form a dopant-containing layer on the substrate, removing desorbed dopant-containing film precursor and/or reaction by-product from the volume surrounding the dopant-containing layer when present after reacting the adsorbed precursor, and repeating this process sequence to form multiple dopant-containing layers of the dopant-containing film.

DETAILED DESCRIPTION

In the following description, numerous specific details are set forth in order to provide a thorough understanding of the present invention. However, the present invention may be practiced without some or all of these specific details. In other instances, well known process operations have not been described in detail so as to not unnecessarily obscure the present invention. While the invention will be described in conjunction with specific detailed embodiments, it is to be understood that these specific detailed embodiments are not intended to limit the scope of the inventive concepts disclosed herein.

The semi-conductive region between source and drain in an IC transistor is referred to as the channel or the transistor's channel region. Electrical potential applied by the gate to the channel region affects its polarization and conductivity, effectively switching the transistor from 'on' to 'off' states and vice versa. Accordingly, channel conductivity and the ability to consistently adjust it via the gate are key aspects of IC transistor design and fabrication. In the fabrication of traditional planar IC transistors, ion implantation techniques are generally employed to dope the channel region and adjust its conductivity to a desired level. However, with the move to 3-D transistors having a channel region formed in a high-aspect ratio fin-shaped structure (in some cases, having a width of less than about 32 nanometers, or less than about 22 nanometers, or less than about 12 nanometers), ion implantation techniques have proven ineffective for providing uniform and controlled doping.

Figure 2B:
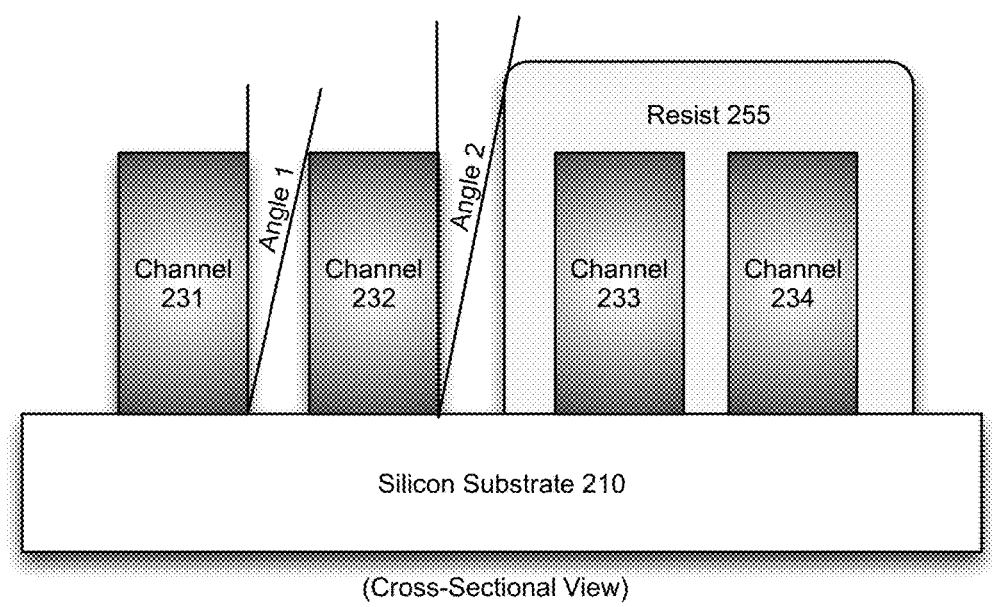
FIG. 2B also schematically illustrates the shadowing effect which may occur when attempting to dope the channel region of high aspect ratio fin-shaped structures via conventional ion-implantation techniques. This figure illustrates the scenario where the shadowing effect of an adjacent fin structure is increased due to the presence of a pattern mask layer.
Figure 2C:
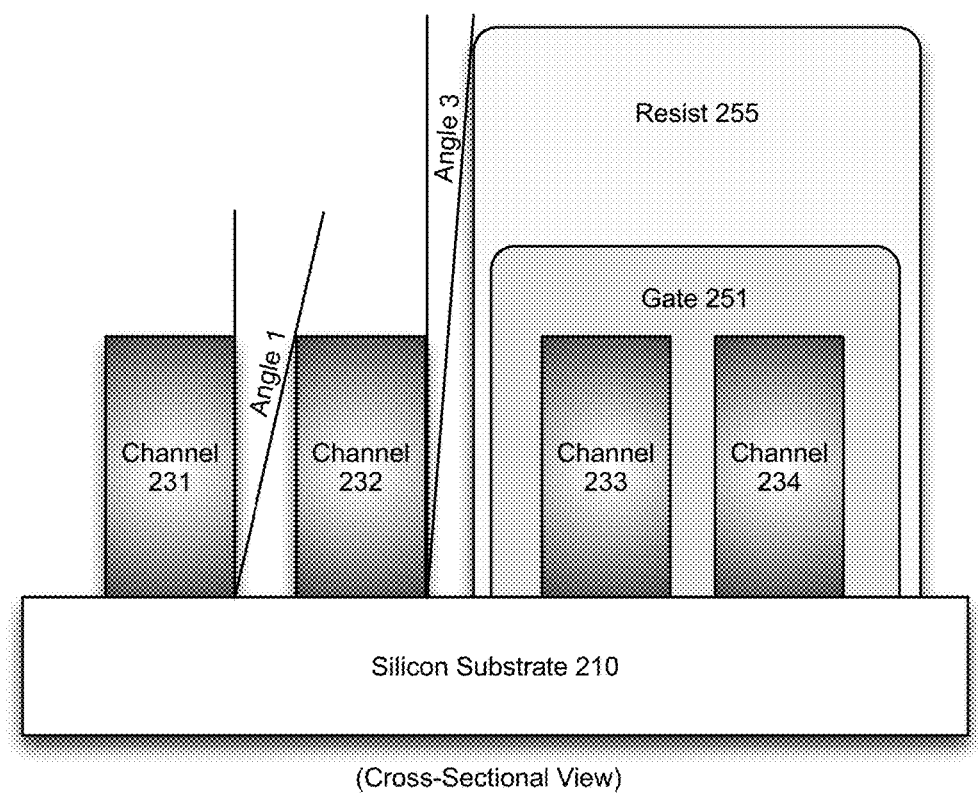
FIG. 2C again schematically illustrates the shadowing effect which may occur when attempting to dope the channel region of high aspect ratio fin-shaped structures via conventional ion-implantation techniques. This figure illustrates the scenario where the shadowing effect of an adjacent fin structure is increased due to the presence of deposited gate electrode material and also by the presence of a pattern mask layer.

The difficulty with ion-implantation techniques is schematically illustrated in FIGS. 2A and 2B. FIG. 2A provides a cross-sectional view (analogous to that shown in FIG. 1B) of four fin-shaped channel regions 231, 232, 233, 234 of four 3-D transistors arranged in parallel (similar to that shown in FIG. 1D). Two of the channels 233, 234 have had gate material 251 applied to them. Schematically indicated in the figure are the possible incident angles of ion-flux which will reach the base of channels 231 and 232—clearing the adjacent vertical structure—and thus may be used to uniformly dope the side of each channel. 'Angle 1' in the figure shows that only a small range of incident angles will reach the base of channel 231 due to the shadowing effect of adjacent channel 232. Doping the sides of the channels obviously requires that the ion-flux have some horizontal component (so as to not just bombard the top), but the figure illustrates that if the horizontal component is too great the side of the channel will be differentially bombarded—with more ions reaching the upper portions than the lower portions. Thus, for channel 231, uniform bombardment requires that incident ion-flux angles be restricted to a range between zero and Angle 1. In practice, however, because the fin-shaped channels have a high aspect ratio and are closely spaced, Angle 1 represents a relatively narrow range of ion fluxes difficult to achieve consistently due to, for example, electromagnetic field fluctuations in the plasma generating the ions, intra-ion collisions in the collimated ion flux, etc. Angle 2, also indicated in FIG. 2A, shows that the problem is amplified for channel 232 due to the presence of gate material 251 atop adjacent channel 233. FIG. 2B illustrates that the problem is similarly amplified for channel 232 if the adjacent channel 233 is masked with a layer of resist material 255. Moreover, FIG. 2C illustrates that the problem is greatly exacerbated if adjacent channel 233 is masked with a layer of resist material 255 atop an already present layer of gate material 251—compare Angle 3 in FIG. 2C with Angle 2 in FIGS. 2A and 2B.

Accordingly, techniques other than ion-implantation are sought to achieving consistent, uniform, and cost-effective doping of fin-shaped channel regions in 3-D transistors. An approach disclosed herein is to dope high aspect-ratio vertical fin-shaped channel structures using a dopant-containing film after conformally depositing it on the vertical structure. The basic idea is illustrated in FIGS. 3A and 3B. FIG. 3A illustrates the basic structure of a dopant-containing film 310 combined with a capping film 320. FIG. 3B illustrates this film conformally deposited on a vertical fin-shaped channel structure 131. Because the film substantially conforms to the shape of the target structure, diffusive transfer of dopant from the film to the target structure, e.g. with a thermal anneal, will result in uniform doping of the target structure. Details of such conformal films including composition, techniques for depositing them, the transferring of dopant from the film to the channel structure, as well as associated apparatuses for accomplishing these operations are described in detail herein. It is also noted, more generally, that doping via conformally deposited films may also be useful for doping other types of high aspect ratio devices structures, and may be appropriately used in many scenarios where conventional ion implantation or directional doping methods are inadequate. For instance, in addition to conventional silicon-based microelectronics, other applications of conformal doping may include microelectronics and optoelectronics based on III-V semiconductors such as GaAs, and II-VI semiconductors such as HgCdTe, as well as photovoltaics, flat panel displays, and electrochromic technology.

However, although conformal doping may offer distinct advantages in terms of the potential for uniform vertical doping of the target structure (e.g., versus ion implantation techniques), in practice uniform doping, for example with boron or phosphorous, at concentrations relevant to IC transistor fabrication have proven difficult to achieve. The root of this problem has been investigated and, without being limited to a particular theory, it is thought that it stems from rapid back-diffusion of dopant out of the films before sufficient dopant can be driven into the target channel region. In other words, lack of dopant uniformity and/or sufficient concentration in the deposited conformal film due to back-diffusion appears to result in a lack of sufficient uniformity and/or concentration of dopant in the channel region.

Figure 4C:
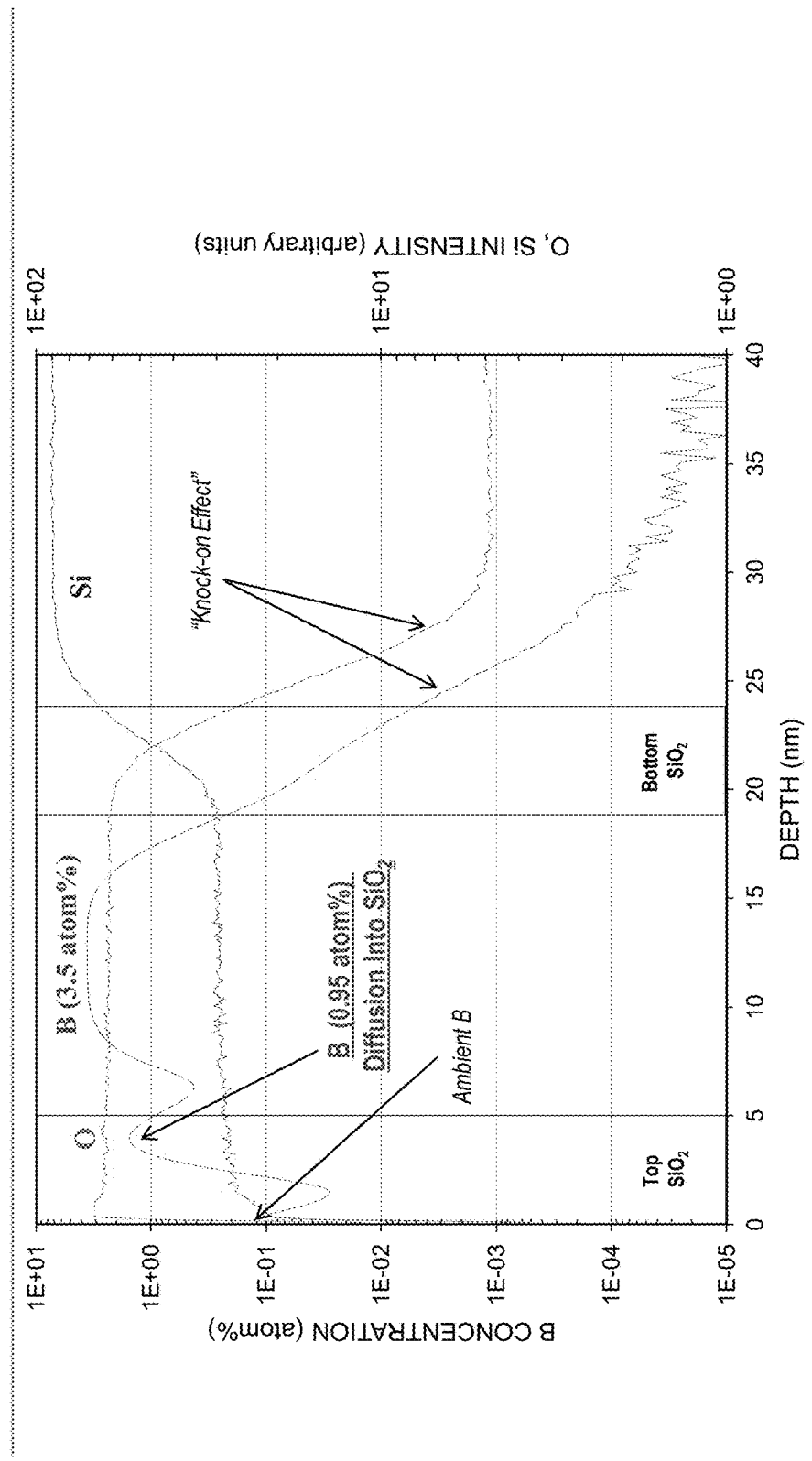
FIG. 4C displays the results of secondary ion mass spectroscopy (SIMS) experiments which demonstrate diffusion of boron dopant through the $SiO_2$ of the films schematically illustrated in FIGS. 4A and 4B.

The problem is demonstrated by the experiments illustrated in FIGS. 4A, 4B, and 4C. The experiments involve conformal deposition of boron-containing films—in particular, borosilicate glass (BSG) films—on the front and back sides of a silicon wafer. The front-side and back-side boron-containing films are illustrated in FIGS. 4A and 4B, respectively, and as shown in the figures, each includes a dopant-containing borosilicate glass film sandwiched between two silicon dioxide ($SiO_2$) layers. The $SiO_2$ film formed on the side of the BSG film opposite the silicon wafer may be referred to as a "capping layer" or "capping film," though it should be understood that these terms do not necessarily imply that the referred to film/layer is the uppermost film/layer relative to the wafer. Instead, these terms as used herein simply imply that some dopant-containing film is located between the "capping" film/layer and the substrate. FIGS. 4A and 4B indicate that the dopant-containing films were formed via an ALD (atomic layer deposition) process and that the BSG film was deposited to a thickness about double that of the sandwiching $SiO_2$ films (100 versus 50 Angstroms, respectively). After deposition, the films were annealed to accelerate the rate of diffusion of boron dopant out of the BSG film and into the adjacent films and wafer substrate.

Concentrations of boron dopant and other chemical species (silicon, oxygen) were then measured by secondary ion mass spectroscopy (SIMS) using a 500 keV beam of oxygen ions ($O^+$) and the results are shown in FIG. 4C. As indicated in FIG. 4C, the SIMS experiments reveal a peak in boron concentration at the edge of the top $SiO_2$ film adjacent to the BSG film as well as a corresponding dip in boron concentration at the adjacent edge of the BSG film, the presence of both effects resulting from back-diffusion of boron atoms out of the edge of the BSG film. FIG. 4C also shows the presence of some boron in the bottom $SiO_2$ layer, as well as boron and oxygen deep into the underlying silicon substrate. However, it is thought that the presence of these species in these regions is due to the so-called "knock-on effect" of the 500 keV $O^+$ ion beam—essentially, that the high kinetic energy of ions in the beam has "knocked" these atoms deeper into the film and substrate—and hence these measurements are not indicate of the film and substrate compositions prior to the experiment. In any event, the boron peak in the top $SiO_2$ film and corresponding adjacent boron dip in the BSG film—which cannot be a result of "knock-on effect"—demonstrate the occurrence of dopant back-diffusion, and also the fact that an $SiO_2$ capping film does a poor job of preventing it.

Figure 5:
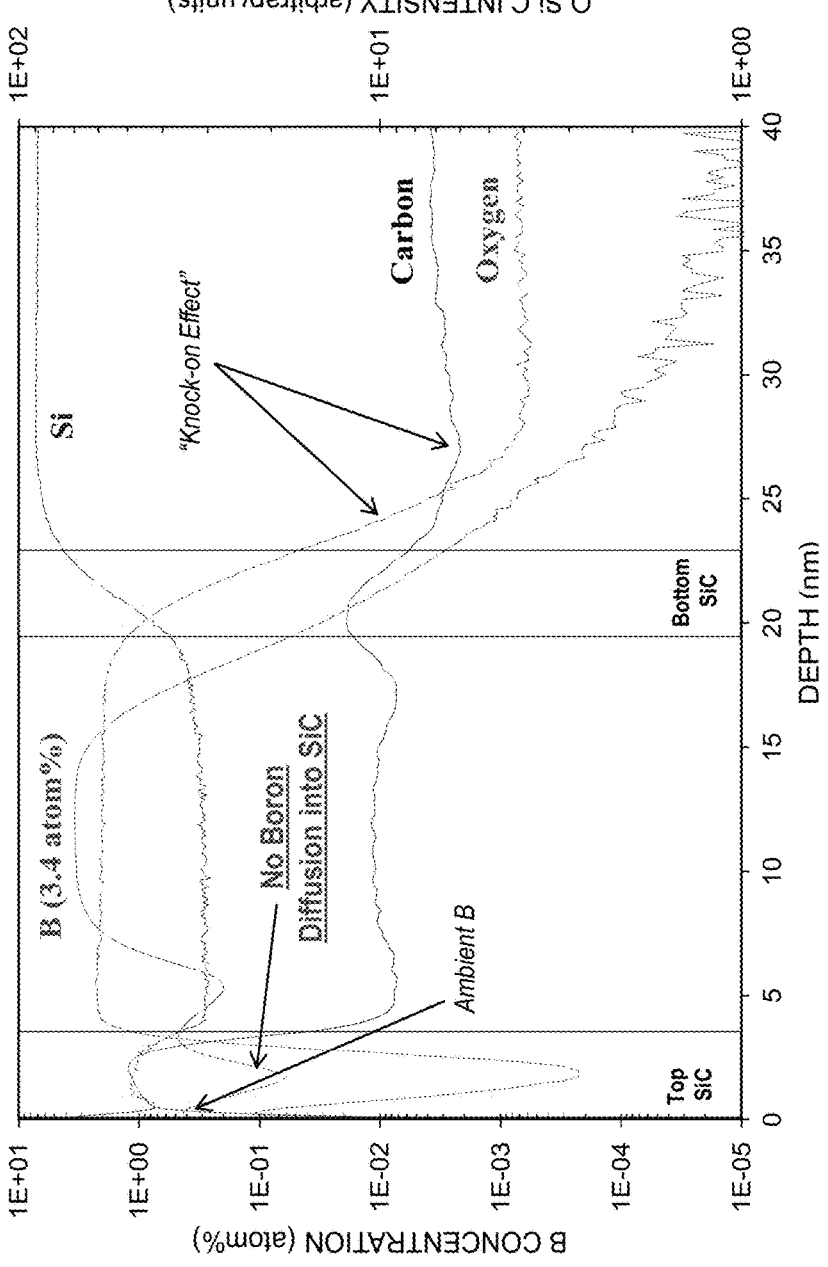
FIG. 5 displays the results of SIMS experiments demonstrating reduced diffusion of boron dopant through silicon carbide (SiC) layers sandwiching a BSG film relative to the dopant diffusion exhibited through $SiO_2$ exhibited in FIG. 4C.

As stated above, back-diffusion of dopant out of a deposited film adversely affects dopant concentration in the film and thus the film's utility as a tool for doping an underlying material in a uniform manner. However, it has been discovered that while a capping film of $SiO_2$ does a poor job of preventing boron-back diffusion out of a conformal dopant-containing film, capping films formed from a silicon carbide material, a silicon nitride material, a silicon carbonitride material, or a combination thereof, are substantially more effective. For example, the effects of using a silicon carbide (SiC) capping film are demonstrated by the experimental results shown in FIG. 5. FIG. 5 presents SIMS results for a boron dopant-containing film having a SiC capping film which are analogous to the SIMS results presented in FIG. 4 for a $SiO_2$ capping film. The structure of the SiC-capped films are the same as the films schematically illustrated in FIGS. 4A and 4B but with the substitution of SiC for $SiO_2$. FIG. 5 shows that the boron peak appearing in the top SiC film adjacent to the BSG film is substantially reduced relative to the boron peak at the same location in the $SiO_2$ film of FIG. 4, thereby confirming that a SiC capping film does a substantially better job of preventing boron back-diffusion than an equivalent capping film formed from $SiO_2$ material.

Accordingly, due to the advantages associated with reducing or preventing dopant back-diffusion, disclosed herein are methods of doping the channel regions of partially fabricated 3-D transistors on semiconductor substrates which include forming a capping film comprising a silicon carbide (SiC) material, a silicon nitride material (SiN), a silicon carbonitride (SiCN) material, or a combination thereof. So as to reduce or prevent dopant diffusion, the SiC/SiN/SiCN capping film is located such that at least a portion of the dopant-containing film is located in between the substrate and the capping film. In this manner, during a thermal anneal, for example, to transfer dopant to the target region of the substrate, the capping film may block diffusion of dopant out of the dopant-containing film and away from the fin-shaped channel region by 20% or more, or 30% or more, or 40% or more, or 50% or more, or 60% or more, or 70% or more, or 80% or more, or 90% or more relative to the rate of diffusion during the same thermal anneal conditions in the absence of the capping film.

Figures 6A, 6B:
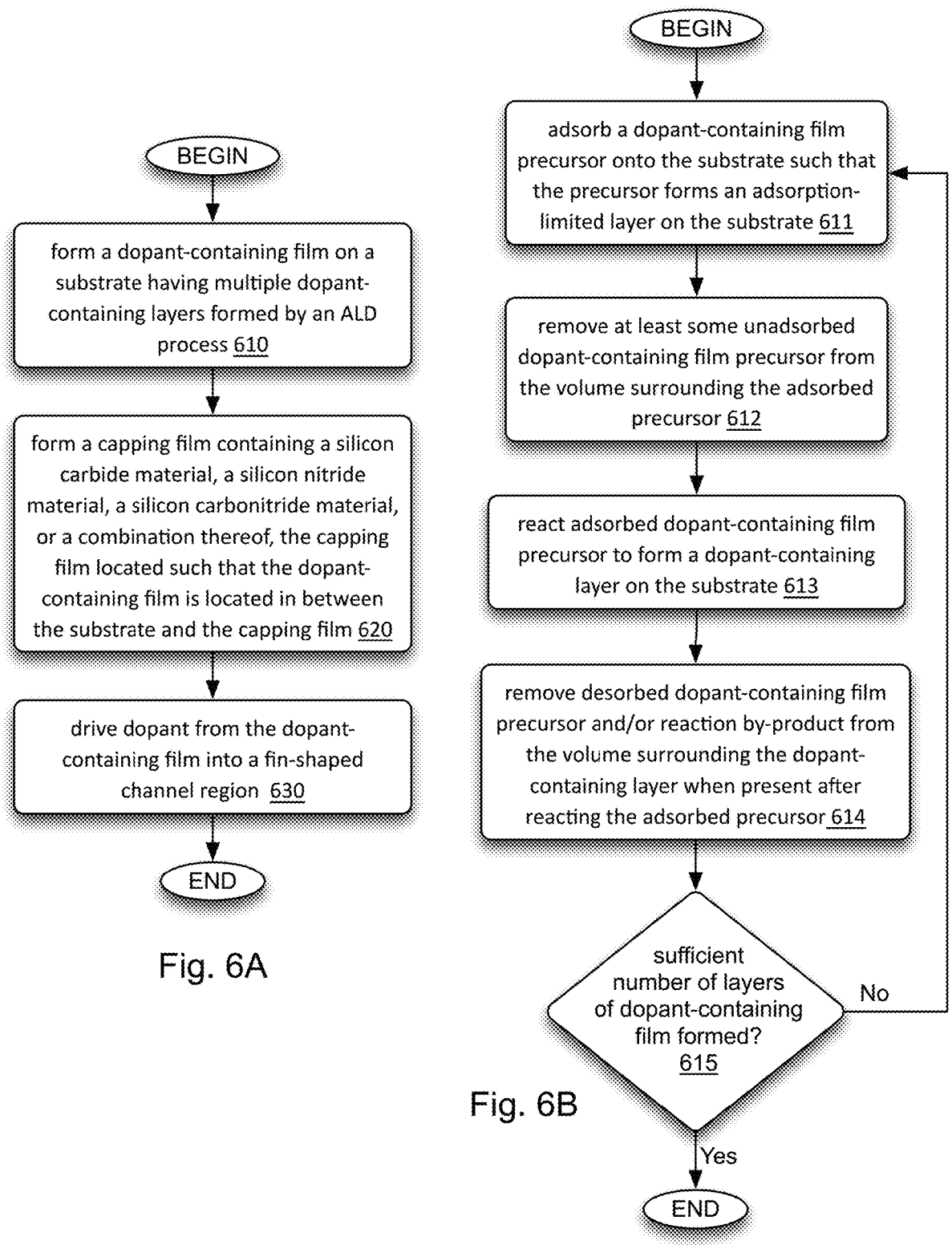
FIG. 6A presents a flowchart schematically illustrating a method of doping a fin-shaped channel region of a partially fabricated 3-D transistor on a semiconductor substrate using a dopant-containing film and a capping film having a silicon carbide material, a silicon nitride material, a silicon carbonitride material, or a combination thereof.
FIG. 6B present a flowchart of an atomic layer deposition (ALD) process sequence for depositing a dopant-containing film.

Certain such methods are schematically illustrated by the flow diagram of FIG. 6A. As indicated in the figure, the methods begin with an operation 610 of forming a dopant-containing film on a substrate having multiple dopant-containing layers formed by an ALD process. The methods then proceed with an operation 620 of forming a capping film containing a silicon carbide material, a silicon nitride material, a silicon carbonitride material, or a combination thereof, wherein (as indicated above) the capping film is located such that the dopant-containing film is located in between the substrate and the capping film. Finally, the transfer of dopant to the fin-shaped channel region of the 3-D transistor occurs in an operation 630 involving driving dopant from the dopant-containing film into the channel region. A thermal anneal may be used for this purpose, for example. In some embodiments, a laser anneal, spike anneal, laser spike anneal, rapid thermal processing (RTP), rapid thermal anneal (RTA), or millisecond anneal, may be used. In many of these instances, the driving of dopant into the channel region is achieved within a "low thermal budget" by generating a high temperature, but for just a short time. In some embodiments, the dopant may be boron. In other embodiments, the dopant may be phosphorous or arsenic. Other dopant species may also be advantageously transferred to a target structure/region on a semiconductor substrate utilizing these techniques. In some sequences of IC fabrication operations, at least a portion of the dopant containing film and/or capping film may be removed after dopant is driven into the target structure/region.

As discussed above, in order to achieve a uniform dopant concentration in the target structure, it is important that the deposited dopant-containing film substantially conform to the shape of the target structure. While, in principle, any workable method of depositing a conformal dopant-containing film may potentially be used in conjunction with the foregoing channel region doping approach, the technique often referred to in the art as atomic layer deposition (ALD) has been found an effective choice.

In contrast with chemical vapor deposition (CVD) process, where activated gas phase reactions are used to deposit films, ALD processes use surface-mediated deposition reactions to deposit films on a layer-by-layer basis. For instance, in one class of ALD processes, a first film precursor (P1) is introduced in a processing chamber in the gas phase, is exposed to a substrate, and is allowed to adsorb onto the surface of the substrate (typically at a population of surface active sites). Some molecules of P1 may form a condensed phase atop the substrate surface, including chemisorbed species and physisorbed molecules of P1. The volume surrounding the substrate surface is then evacuated to remove gas phase and physisorbed P1 so that only chemisorbed species remain. A second film precursor (P2) may then be introduced into the processing chamber so that some molecules of P2 adsorb to the substrate surface. The volume surrounding the substrate within the processing chamber may again be evacuated, this time to remove unbound P2. Subsequently, energy provided to the substrate (e.g., thermal or plasma energy) activates surface reactions between the adsorbed molecules of P1 and P2, forming a film layer. Finally, the volume surrounding the substrate is again evacuated to remove unreacted P1 and/or P2 and/or reaction by-product, if present, ending a single cycle of ALD.

ALD techniques for depositing conformal films having a variety of chemistries—and also many variations on the basic ALD process sequence—are described in detail in U.S. patent application Ser. No. 13/084,399, filed Apr. 11, 2011, titled "PLASMA ACTIVATED CONFORMAL FILM DEPOSITION" (Attorney Docket No. NOVLP405), U.S. patent application Ser. No. 13/242,084, filed Sep. 23, 2011, titled "PLASMA ACTIVATED CONFORMAL DIELECTRIC FILM DEPOSITION," now U.S. Pat. No. 8,637,411 (Attorney Docket No. NOVLP427), U.S. patent application Ser. No. 13/224,240, filed Sep. 1, 2011, titled "PLASMA ACTIVATED CONFORMAL DIELECTRIC FILM DEPOSITION" (Attorney Docket No. NOVLP428), and U.S. patent application Ser. No. 13/607,386, filed Sep. 7, 2012, titled "CONFORMAL DOPING VIA PLASMA ACTIVATED ATOMIC LAYER DEPOSITION AND CONFORMAL FILM DEPOSITION" (Attorney Docket No. NOVLP488), each of which is incorporated by reference herein in its entirety for all purposes. As described in these prior applications, a basic ALD cycle for depositing a single layer of material on a substrate may include: (i) adsorbing a film precursor onto a substrate such that it forms an adsorption-limited layer, (ii) removing unadsorbed precursor from the volume surrounding the adsorbed precursor, (iii) reacting the adsorbed-precursor to form a layer of film on the substrate, and (iv) removing desorbed film precursor and/or reaction by-product from the volume surrounding the layer of film formed on the substrate. The removing in operations (ii) and (iv) may be done via purging, evacuating, pumping down to a base pressure ("pump-to-base"), etc. the volume surrounding the substrate. It is noted that this basic ALD sequence of operations (i) through (iv) doesn't necessary involve two chemiadsorbed reactive species P1 and P2 as in the example described above, nor does it even necessarily involve a second reactive species, although these possibilities/options may be employed, depending on the desired deposition chemistries involved.

Due to the adsorption-limited nature of ALD, however, a single cycle of ALD only deposits a thin film of material, and oftentimes only a single monolayer of material. For example, depending on the exposure time of the film precursor dosing operations and the sticking coefficients of the film precursors (to the substrate surface), each ALD cycle may deposit a film layer only about 0.5 to 3 Angstroms thick. Thus, the sequence of operations in a typical ALD cycle—operations (i) through (iv) just described—are generally repeated multiple times in order to form a conformal film of the desired thickness. Thus, in some embodiments, operations (i) through (iv) are repeated consecutively at least 1 time, or at least 2 times, or at least 3 times, or at least 5 times, or at least 7 times, or at least 10 times in a row. Dopant ALD film may be deposited at a rate of about or between 0.1 Å and 2.5 Å per ALD cycle, or about or between 0.2 Å and 2.0 Å per ALD cycle, or about or between 0.3 Å and 1.8 Å per ALD cycle, or about or between 0.5 Å and 1.5 Å per ALD cycle, or about or between 0.1 Å and 1.5 Å per ALD cycle, or about or between 0.2 Å and 1.0 Å per ALD cycle, or about or between 0.3 Å and 1.0 Å per ALD cycle, or about or between 0.5 Å and 1.0 Å per ALD cycle.

In some film forming chemistries, an auxiliary reactant or co-reactant—in addition to what is referred to as the "film precursor"—may also be employed. In certain such embodiments, the auxiliary reactant or co-reactant may be flowed continuously during a subset of steps (i) through (iv) or throughout each of steps (i) through (iv) as they are repeated. In some embodiments, this other reactive chemical species (auxiliary reactant, co-reactant, etc.) may be adsorbed onto the substrate surface with the film precursor prior to its reaction with the film precursor (as in the example involving precursors P1 and P2 described above), however, in other embodiments, it may react with the adsorbed film precursor as it contacts it without prior adsorption onto the surface of the substrate, per se. Also, in some embodiments, operation (iii) of reacting the adsorbed film precursor may involve contacting the adsorbed film precursor with a plasma. The plasma may provide energy to drive the film-forming reaction on the substrate surface. In certain such embodiments, the plasma may be an oxidative plasma generated in the reaction chamber with application of suitable RF power (although in some embodiments, it may be generated remotely). In other embodiments, instead of an oxidative plasma, an inert plasma may be used. The oxidizing plasma may be formed from one or more oxidants such as $O_2$, $N_2O$, or $CO_2$, and may optionally include one or more diluents such as Ar, $N_2$, or He. In one embodiment, the oxidizing plasma is formed from $O_2$ and Ar. A suitable inert plasma may be formed from one or more inert gases such as He or Ar. Further variations on ALD processes are described in detail in the prior patent applications just cited (and which are incorporated by reference).

Accordingly, a basic sequence of operations for forming a dopant-containing film via an ALD process is schematically illustrated by the flowchart in FIG. 6B. A shown in the figure, an ALD process for forming multiple dopant-containing layers of film on a substrate may begin with an operation 611 of adsorbing a dopant-containing film precursor onto the substrate such that the precursor forms an adsorption-limited layer on the substrate, followed by an operation 612 of removing at least some unadsorbed dopant-containing film precursor from the volume surrounding the adsorbed precursor. Thereafter, in an operation 613, the adsorbed dopant-containing film precursor is reacted to form a dopant-containing layer on the substrate, and following that, in operation 614, desorbed dopant-containing film precursor and/or reaction by-product is removed from the volume surrounding the dopant-containing layer when present after reacting the adsorbed precursor in operation 613.

The foregoing sequence of operations 611 through 614 represents once ALD cycle.

However, since a single ALD cycle typically only deposits a thin layer of film, multiple ALD cycles may be repeated in sequence to form multiple layers of dopant-containing film (or, equivalently, a multi-layer dopant containing film of the desired thickness). Thus, referring again to FIG. 6B, after an ALD cycle concludes with operation 614, in operation 615, it is determined whether a sufficient number of layers of dopant-containing film have been formed (or whether a film of a sufficient thickness has been deposited), and if so, the film-forming operations conclude, whereas if not, the process sequence returns to operation 611 to begin another cycle of ALD. It is noted that FIGS. 6A and 6B may be viewed in combination as a method of doping a channel region of a 3-D transistor with operation 610 (FIG. 6A) of forming a dopant-containing film including the ALD process sequence of operations 611 through 615 (FIG. 6B).

In some embodiments, a dopant-containing film for doping the fin-shaped channel region of a partially fabricated 3-D transistor may include dopant-rich portions as well as substantially dopant-free portions (in addition to the capping film which may be dopant-free). Thus, for example, in some embodiments, a dopant-containing film may include a first dopant-rich portion formed by conformally depositing multiple dopant-containing layers sequentially, without intervening deposition of a substantially dopant-free layer, and a first substantially dopant-free portion formed by conformally depositing multiple substantially dopant-free layers sequentially, without intervening deposition of a dopant-containing layer.

Moreover, in certain such embodiments, there may be multiple dopant-rich portions and multiple substantially dopant-free portions which form a structure of alternating composition in the deposited film. One reason for doing this arises from the fact that, in some cases, it has been found that depositing dopant-containing film layers sequentially, using sequential ALD cycles, may be self-inhibiting (at least to a certain extent in some embodiments), and the growth rate may continue to drop after more and more dopant-rich layers have been deposited. For example, in one experiment, the total thickness of a $B_2O_3$ film deposited using sequential ALD cycles was found to not significantly change between the 50th ALD cycle and the 100th ALD cycle. As a result, in some embodiments, for some dopants, and for some dopant-containing film precursors, the quantity of dopant in an ALD-formed conformal film may not be effectively increased by sequentially depositing additional dopant-rich layers. These aspects are described in detail in U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION" (Attorney Docket No. NOVLP488), which is incorporated by reference herein in its entirety for all purposes.

Figure 7:
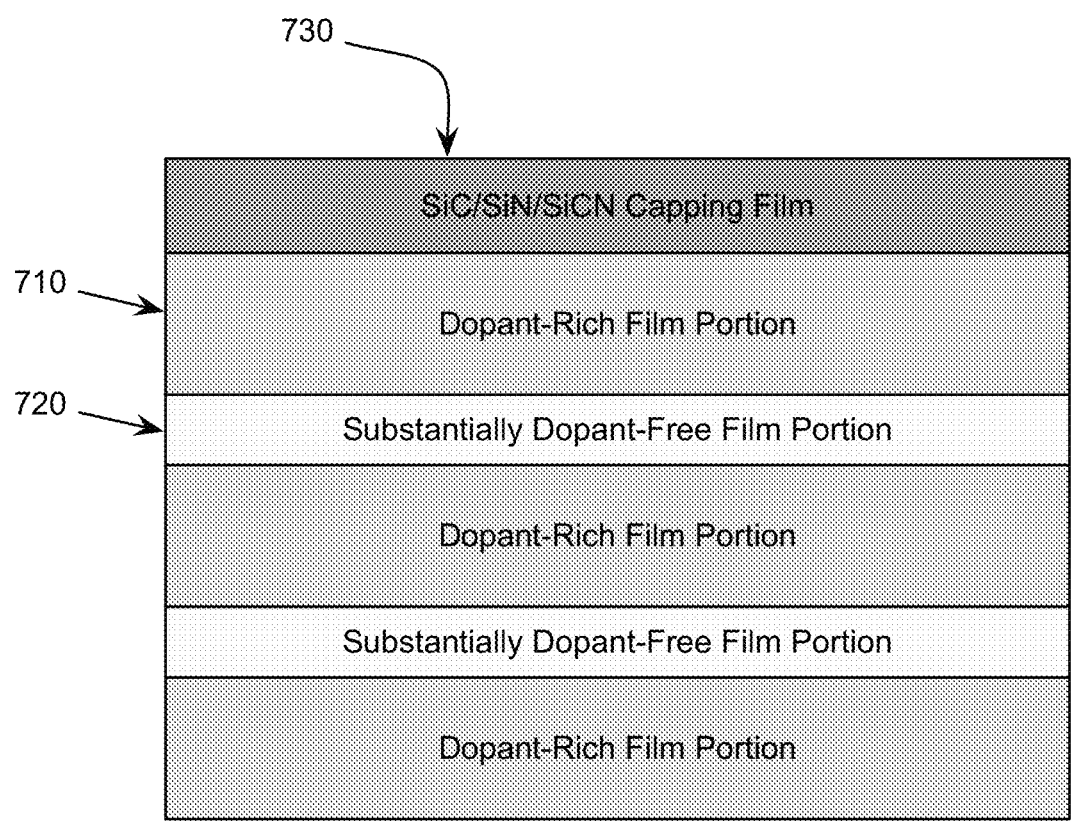
FIG. 7 schematically illustrates a dopant-containing film similar to that illustrated in FIG. 3A but in FIG. 7 exhibiting a film structure wherein dopant-rich portions are interspersed with substantially dopant-free portions.

Thus, it may be desirable to form dopant-containing films of alternating composition—alternating between dopant-rich and substantially dopant-free portions. Therefore, in these sorts of embodiments, a dopant-containing film may additionally include a second dopant-rich portion (also formed by conformally depositing multiple dopant-containing layers sequentially, without intervening deposition of a substantially dopant-free layer), and also a second substantially dopant-free portion of the film (again, formed by conformally depositing multiple substantially dopant-free layers sequentially, without intervening deposition of a dopant-containing layer); and these first and second, dopant-rich and substantially dopant-free portions may be arranged such that they alternate with one another by composition—e.g., the first substantially dopant-free portion is located between the first and second dopant-rich portions, the second dopant-rich portion is located between the first and second substantially dopant-free portions. In such an arrangement, the capping film may be located such that the first and second dopant-rich portions and the first and second substantially dopant-free portions are in between it and the substrate. FIG. 7 provides a schematic of one such example film 700 having dopant-rich portions 710 alternating with substantially dopant-free portions 720, and also having a SiC/SiN/SiCN capping film 730.

The dopant-rich portions of such films may be formed in multiple layers by multiple ALD cycles as described above, e.g., with respect to FIG. 6B. However, multiple ALD cycles may also be used to form multiple layers of the substantially dopant-free portions of such films, albeit using a dopant-free (instead of a dopant-containing) film precursor. Thus, for instance, in some embodiments, forming each of the first and second substantially dopant-free portions just described (e.g., see FIG. 7) may include (i) adsorbing a dopant-free film precursor onto the substrate such that the precursor forms an adsorption-limited layer, thereafter (ii) removing unadsorbed dopant-free film precursor from the volume surrounding the adsorbed precursor, then (iii) reacting the adsorbed dopant-free film precursor after removing unadsorbed precursor to form a substantially dopant-free layer on the substrate, and finally (iv) removing desorbed dopant-free film precursor and/or reaction by-product from the volume surrounding the substantially dopant-free layer when present after reacting the adsorbed precursor. As stated, multiple ALD cycles may be used to form multiple layers, and so the foregoing sequence of operations (i) through (iv) may be repeated multiple times to form multiple substantially dopant-free layers of the dopant-containing film. It is noted that, in some embodiments, these substantially dopant-free layers may include a dielectric material, and that, in certain such embodiments, the dielectric material may be $SiO_2$.

Further examples of conformal films having portions of alternating composition—including films used for doping an underlying target IC structure or substrate region—as well as methods of forming these films, are described in detail in: U.S. patent application Ser. No. 13/084,399, filed Apr. 11, 2011, and titled "PLASMA ACTIVATED CONFORMAL FILM DEPOSITION" (Attorney Docket No. NOVLP405); U.S. patent application Ser. No. 13/242,084, filed Sep. 23, 2011, and titled "PLASMA ACTIVATED CONFORMAL DIELECTRIC FILM DEPOSITION," now U.S. Pat. No. 8,637,411 (Attorney Docket No. NOVLP427); U.S. patent application Ser. No. 13/224,240, filed Sep. 1, 2011, and titled "PLASMA ACTIVATED CONFORMAL DIELECTRIC FILM DEPOSITION" (Attorney Docket No. NOVLP428); and U.S. patent application Ser. No. 13/607,386, filed Sep. 7, 2012, and titled "CONFORMAL DOPING VIA PLASMA ACTIVATED ATOMIC LAYER DEPOSITION AND CONFORMAL FILM DEPOSITION" (Attorney Docket No. NOVLP488); each of which is incorporated by reference herein in its entirety for all purposes.

Details Regarding the Capping Film

In some embodiments, the capping film may also be formed via an ALD process. For example, in some embodiments, multiple layers of the capping film may be deposited via the sequence of operations (i) through (iv) (just described) repeated multiple times to form multiple layers of the capping film. However, while substantially dopant-free layers of $SiO_2$ may be interspersed with the dopant-rich portions of the film, for the reasons described above with respect to FIGS. 4 and 5, the capping film would typically be composed of a material suitable for blocking dopant back-diffusion such as SiC, SiN, SiCN, or a combination thereof. In other embodiments, a chemical vapor deposition (CVD) process may be used to form the capping film, and in certain such embodiments, a plasma-enhanced chemical vapor deposition (PECVD) process. However, since CVD/PECVD processes proceed via gas phase reactions rather than through the formation of an adsorption-limited layer of reactants, they produce less conformal films than ALD techniques, and therefore ALD processes are generally preferred for forming the capping films described herein.

The capping film will generally have a sufficient concentration of SiC, SiN, SiCN, or combination thereof, and be formed of sufficient thickness to block back-diffusion of dopant to the desired extent feasible based on the chemistries and rates of diffusion involved. For instance, in some embodiments, the average concentration of SiC in the capping film may be between about 1 and 4 $g/cm^3$, or between about 2 and 3 $g/cm^3$, or between about 2.2 and 2.8 $g/cm^3$. Likewise, in some embodiments, the average concentration of SiCN in the capping film may be between about 1 and 4 $g/cm^3$, or between about 2 and 3 $g/cm^3$, or between about 2.2 and 2.8 $g/cm^3$, and, in some embodiments, the average concentration of SiN in the capping film may be between about 1 and 4 $g/cm^3$, or between about 2 and 3 $g/cm^3$, or between about 2.2 and 2.8 $g/cm^3$. Finally, in some embodiments, the average combined concentration of SiC, SiN, and SiCN in the capping film may be between about 1 and 4 $g/cm^3$, or between about 2 and 3 $g/cm^3$, or between about 2.2 and 2.8 $g/cm^3$.

Likewise, depending on the embodiment, a capping film may be formed having an average thicknesses of about 1, 2, 3, 5, 10, 20, 30, 40, 50, 100, 150, 200, 300, or 500 Angstroms, or the capping film corresponding to a given embodiment may have an average thickness within a range defined on the low end and high end by any pair of the aforementioned thicknesses such as, for example, a capping film may have an average thickness between about 1 and 500 Angstroms, or between about 5 and 200 Angstroms, or between about 10 and 100 Angstroms. In some embodiments, the capping film may be a substantially conformal film—such as, for example, if it is formed via an ALD process—and thus it may be of relatively consistent thickness, quantifiable, for example, by the relative standard deviation in the film's thickness. Thus, in embodiments where the capping film is substantially conformal, the relative standard deviation in its thickness may be less than about 20%, or less than about 15%, or less than about 10%, or less than about 5%, or less than about 4%, or less than about 3%, or less than about 2%, or less than about 1%, or even less than about 0.1%.

ALD Process Conditions

ALD processes for forming the dopant-containing films and/or capping films may be performed at various temperatures. In some embodiments, suitable temperatures within an ALD reaction chamber may range from between about 25° C. and 450° C., or between about 50° C. and 300° C., or between about 20° C. and 400° C., or between about 200° C. and 400° C., or between about 100° C. and 350° C.

Likewise, ALD processes for forming the dopant-containing films and/or capping films may be performed at various ALD reaction chamber pressures. In some embodiments, suitable pressures within the reaction chamber may range from between about 10 mTorr and 10 Torr, or between about 20 mTorr and 8 Torr, or between about 50 mTorr and 5 Torr, or between about 100 mTorr and 2 Torr.

Various RF power levels may be employed to generate a plasma if used in operation (iii). In some embodiments, suitable RF power may range from between about 100 W and 10 kW, or between about 200 W and 6 kW, or between about 500 W, and 3 kW, or between about 1 kW and 2 kW.

Various dopant-containing film precursor flow rates may be employed in operation (i). In some embodiments, suitable flow rates may range from about or between 0.1 mL/min to 10 mL/min, or about or between 0.5 mL/min and 5 mL/min, or about or between 1 mL/min and 3 mL/min.

Various gas flow rates may be used in the various operations. In some embodiments, general gas flow rates may range from about or between 1 L/min and 20 L/min, or about or between 2 L/min and 10 L/min. For the optional inert purge steps in operations (ii) and (iv), an employed burst flow rate may range from about or between 20 L/min and 100 L/min, or about or between 40 L/min and 60 L/min.

Once again, in some embodiments, a pump-to-base step refers to pumping the reaction chamber to a base pressure by directly exposing it to one or more vacuum pumps. In some embodiments, the base pressure may typically be only a few milliTorr (e.g., between about 1 and 20 mTorr). Furthermore, as indicated above, a pump-to-base step may or may not be accompanied by an inert purge, and thus carrier gases may or may not be flowing when one or more valves open up the conductance path to the vacuum pump.

Chemistries for Formation of Capping Films

Various film-forming chemistries may be used for forming the capping film. Capping films may preferably contain a silicon carbide (SiC) material, a silicon nitride (SiN) material, a silicon carbonitride (SiCN) material, or a combination thereof. Methods, techniques, and operations for depositing these types of films are described in detail in U.S. patent application Ser. No. 13/494,836, filed Jun. 12, 2012, titled "REMOTE PLASMA BASED DEPOSITION OF SiOC CLASS OF FILMS," Attorney Docket No. NOVLP466/NVLS003722; U.S. patent application Ser. No. 13/907,699, filed May 31, 2013, titled "METHOD TO OBTAIN SiC CLASS OF FILMS OF DESIRED COMPOSITION AND FILM PROPERTIES," Attorney Docket No. LAMRP046/3149; and U.S. patent application Ser. No. 14/062,648, titled "GROUND STATE HYDROGEN RADICAL SOURCES FOR CHEMICAL VAPOR DEPOSITION OF SILICON-CARBON-CONTAINING FILMS"; each of which is hereby incorporated by reference in its entirety and for all purposes.

Deposition of such films may utilize one or more silicon-containing film precursors which may be selected from a variety of compounds. Silicon-carbon-containing films (e.g., silicon carbides, silicon-carbon-oxides, silicon carbonitrides, and silicon-carbon-oxynitrides), for instance, may be formed using silicon-containing film precursors such as organosilicon reactants selected and supplied to provide desired composition properties, and in some cases, physical or electronic properties. Examples of suitable organo-silicon reactants/film-precursors may include silanes, alkyl silanes, siloxanes, alkoxy silanes, and amino silanes, among others.

Regarding the silanes, non-limiting examples include silane, disilane, trisilane, and higher silanes.

Regarding the alkyl silanes, these compounds include a central silicon atom with one or more alkyl groups bonded to it as well as one or more hydrogen atoms bonded to it. In certain embodiments, any one or more of the alkyl groups contain 1-5 carbon atoms. The alkyl groups may be saturated or unsaturated. In some embodiments, these alkyl groups may be used to SiC films. Non-limiting examples of alkyl silanes include dimethylsilane (2MS), trimethylsilane (3MS), tetramethylsilane (4MS), triethylsilane (TES), and pentamethyldisilamethane.

Other types of alkyl silanes can include alkylcarbosilanes, alkylaminosilanes, and alkyldisilazanes. Alkylcarbosilanes can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). Alkylaminosilanes include amines with alkyl groups and bonded to a silicon atom. Examples include dimethylamino dimethylsilane (DMADMS), bis-dimethylamino methylsilane (BDMAMS), and tris-dimethylamino silane (TDMAS). In some embodiments, these alkyl silanes can form SiCN films. Alkyldisilazanes include silazanes and alkyl groups bonded to two silicon atoms. An example includes 1,1,3,3-tetramethyldisilazane (TMDSN). In some embodiments, TMDSN can form SiCN films.

Additionally, higher-order silanes may be used in place of monosilanes. An example of one such disilane from the alkyl silane class is hexamethyldisilane (HMDS). Another example of a disilane from the alkyl silane class can include pentamethyldisilane (PMDS), which can be used to form SiC films. In some embodiments, one of the silicon atoms can have a carbon-containing or alkoxy-containing group exclusively attached to it, and one of the silicon atoms can have a hydrogen atom exclusively attached to it.

Regarding the siloxanes, also possible class of organo-silicon film-precursors, in some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes may include, but are not limited to, cyclotrisiloxanes and cyclopentasiloxanes. Cyclic siloxanes are ring structures that may introduce porosity into a SiC film, with the size of the pores corresponding to the radius of the ring. For example, a cyclotetrasiloxane ring can have a radius of about 6.7 Angstroms. In some embodiments, the siloxane may have a three-dimensional or caged structure. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety for all purposes. Like the cyclic siloxanes, the caged siloxane can introduce porosity into a SiC film. In some embodiments, the porosity scale is mesoporous. In some embodiments, the siloxane may be linear. Linear siloxanes may include, but are not limited to, disiloxanes, such as pentamethyldisiloxane (PMDSO), tetramethyldisiloxane (TMDSO), and hexamethyl trisiloxane. PMDSO and TMDSO may be used to form SiOC films. The structural configuration (that is, linear, cyclic, or caged) of the siloxane may affect film porosity properties. For example, cyclic siloxanes may form microporous films having pores sized according to the cyclic ring size, and caged siloxanes may form mesoporous films.

Silicon-carbon-containing films may also include oxygen atoms (e.g., silicon-carbon-oxides and silicon-carbon-oxynitrides) and these may also be formed using siloxanes (e.g., those listed above), as well as other organosilicon reactants that include oxygen, such as the alkoxy silanes. The alkoxy silanes include a central silicon atom with one or more alkoxy groups bonded to it and one or more hydrogen atoms bonded to it. Examples include but are not limited to trimethoxysilane (TMOS), dimethoxysilane (DMOS), methoxysilane (MOS), methyldimethoxysilane (MDMOS), diethoxymethylsilane (DEMS), dimethylethoxysilane (DMES), dimethylaminomethoxysilane (DMAMES), and dimethylmethoxysilane (DMMOS). Many of these precursors may be used to form SiOC films.

Silicon-carbon-containing films may also include nitrogen atoms (e.g., silicon-carbon-nitrides and silicon-carbon-oxynitrides) and may be formed using an organosilicon reactant that includes nitrogen, such as amino silanes and silazanes. Non-limiting examples of amino silanes include 2,2-bis(dimethylamino)-4,4-dimethyl-2,4-disilapentane, 2,2,4-trimethyl-4-dimethylamino-3,4-disilapentane, dimethylaminodimethylsilane, bis(dimethylamino)methylsilane, and tris(dimethylamino)silane. 1,1,3,3-tetramethyldisilazane is a non-limiting example of a silazane. Further examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)_3$).

Furthermore, in some embodiments, a film-precursor may include multiple chemical groups combined into a single precursor. For example, a single precursor can include alkoxy, amino, and alkyl groups, such as DMADMS.

In depositing the SiC-containing film, multiple organosilicon film precursors may be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting SiC film. For example, the amount of siloxane can be greater than the amount of silane in molar percentages to produce a porous film.

For the deposition of silicon nitrides (SiN) and silicon carbonitrides (SiCN), an appropriate silicon-containing reactant/film-precursor, such as those described above, may be used in conjunction with a nitrogen-containing co-reactant. Non-limiting examples of nitrogen-containing co-reactants which may be used include ammonia, hydrazine, amines such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing co-reactant contains at least one nitrogen, but may also contain heteroatoms other than nitrogen. Thus, for example, hydroxylamine, t-butyloxycarbonyl amine, and N-t-butyl hydroxylamine are considered nitrogen-containing reactants.

Finally, for the deposition of silicon oxides ($SiO_x$)—though not preferred by themselves for forming the capping film, in some embodiments, they are preferred for interspersing with dopant-rich portions of a dopant-containing film—an appropriate silicon-containing reactant/film-precursor as described above may be used in conjunction with an appropriate oxidizing reactant. Examples of oxidizing reactants include oxygen, ozone, hydrogen, nitrous oxide, carbon monoxide, mixtures thereof, etc. In one particular example, an oxide film may be deposited by an ALD process using bis(tert-butylamino)silane (BTBAS) as a silicon-containing film precursor in conjunction with oxygen or nitrous oxide serving as an oxidant, e.g. in ALD operation (iii), which may or may not, depending on the embodiment, flow continuously during delivery of the BTBAS (in ALD operation (i)).

Chemistries for Formation of Dopant-Containing Films

As described in the patent applications listed and incorporated by reference above (U.S. patent application Ser. Nos. 13/084,399, 13/242,084, and 13/224,240), various dopant-containing film precursors may be used for forming the dopant-containing films, such as films of boron-doped silicate glass (BSG) (used as the dopant-containing film in the examples of FIGS. 4 and 5 above), phosphorous-doped silicate glass (PSG), boron phosphorus doped silicate glass (BPSG), arsenic (As) doped silicate glass (ASG), and the like. The dopant-containing films may include $B_2O_3$, $B_2O$, $P_2O_5$, $P_2O_3$, $As_2O_3$, $As_2O_5$, and the like.

One preferred dopant-containing film precursor where the dopant is boron is trimethyl borate (TMB). Other suitable boron-containing film precursors may include: other alkyl borates such as triethyl borate, triisopropyl borate, and tri-n-butyl borate, as well as trimethylboron, triethylboron, triphenylboron, tri-i-propyl borate, tri-n-amyl borate, B-tribromoborazine, tris(pentafluorophenyl)borane, and other similar boron containing compounds.

As indicated above, dopant-containing films having dopants other than boron are also feasible. Examples include gallium, phosphorous, or arsenic dopants, or other elements appropriate for doping a semiconductor substrate, such as other valence III and V elements.

Particular dopant-containing films having arsenic as the dopant may include, but are not limited to, arseno-silicate or arsenic-doped silicate glass (ASG), arsenic oxides (e.g., $As_2O_3$, $As_2O_5$), and arsenic oxyhydrides. Dopant-containing film precursors having arsenic as the dopant may include, but are not limited to, the alkylarsine, alkoxyarsine, and aminoarsine chemical families, and include, but are not limited to, the following specific compounds: arsine, triethylaresenate, trimethylarsine, triethylarsine, triphenylarsine, triphenylarsine oxide, ethylenebis(diphenylarsine), tris(dimethylamino)arsine, and $As(OR)_3$ where R is —$CH_3$ or —$C_2H_5$ or other alkyl groups (including saturated and unsaturated alkyl groups), and other similar arsenic containing compounds.

Particular dopant-containing films having phosphorous as the dopant may include, but are not limited to, phosphorus-doped silicate glass (PSG), and phosphorous oxides (e.g., $P_2O_5$, $P_2O_3$). Dopant-containing film precursors having phosphorous as the dopant may include, but are not limited to, triethoxyphosphine oxide, alkyl phosphates such as trimethylphosphate, trimethylphosphite, and other similar phosphorous containing compounds. Choice of dopant precursor is typically dictated by ease of integration into existing delivery systems, purity requirements, and overall cost.

In some embodiments, the dopant-containing film precursor may be used in combination with a silicon-containing film precursor or other co-reactant. Silicon-containing film precursors that may be used for this purpose include, but are not limited to, silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. Other silicon-containing film precursors listed above as applicable to capping-layer formation may also be used for dopant-containing film formation, depending on the embodiment.

Again, multiple ALD cycles may be repeated to build up stacks of conformal layers. In some embodiments, each layer may have substantially the same composition whereas in other embodiments, sequentially ALD deposited layers may have differing compositions, or in certain such embodiments, the composition may alternate from layer to layer or there may be a repeating sequence of layers having different compositions, as described above. Thus, depending on the embodiment, certain stack engineering concepts, such as those disclosed in the patent applications listed and incorporated by reference above (U.S. patent application Ser. Nos. 13/084,399, 13/242,084, and 13/224,240) may be used to modulate boron, phosphorus, or arsenic concentration in these films.

Apparatuses

The methods described herein may be performed with any suitable semiconductor substrate processing apparatus. A suitable apparatus includes hardware for accomplishing the process operations and a system controller having instructions for controlling process operations in accordance with the various channel doping methodologies disclosed herein. In some embodiments, the hardware may include one or more process stations included in a multi-station substrate processing tool, and a controller having (or having access to) machine-readable instructions for controlling process operations in accordance with the processing techniques disclosed herein.

Thus, in some embodiments, an apparatus suitable for doping the fin-shaped channel regions of partially fabricated 3-D transistors on the surfaces of semiconductor substrates may include a plurality of process stations each having a substrate holder contained in one or more processing chambers, one or more valves for controlling flow of dopant-containing film precursor to the process stations, and one or more valve-operated vacuum sources for removing dopant-containing film precursor from the volumes surrounding the process stations contained in the one or more processing chambers. And, such an apparatus may also include a controller having (or having access to) machine-readable instructions for operating the one or more valves and one or more vacuum sources to dope the fin-shaped channel regions on the surfaces of the substrates. Thus, in some embodiments, said instructions executed by the controller may include instructions for forming a dopant-containing film on a substrate at a process station contained in a processing chamber, wherein multiple dopant-containing layers of the film are formed by an ALD process. Thus, in certain such embodiments, said instructions executed by the controller may include instructions for performing ALD operations (i) though (iv) as described above, and instructions for repeating ALD operations (i) through (iv) multiple times to form multiple layers of dopant-containing film on the multiple substrates at the multiple process stations of the substrate processing apparatus. And, in some embodiments, instructions executed by the controller may further include instructions for forming a capping film comprising a silicon carbide material, a silicon nitride material, a silicon carbonitride material, or a combination thereof, and instructions for driving dopant from the dopant-containing film into the fin-shaped channel regions of partially-manufactured 3-D transistors on multiple substrates.

Figure 8:
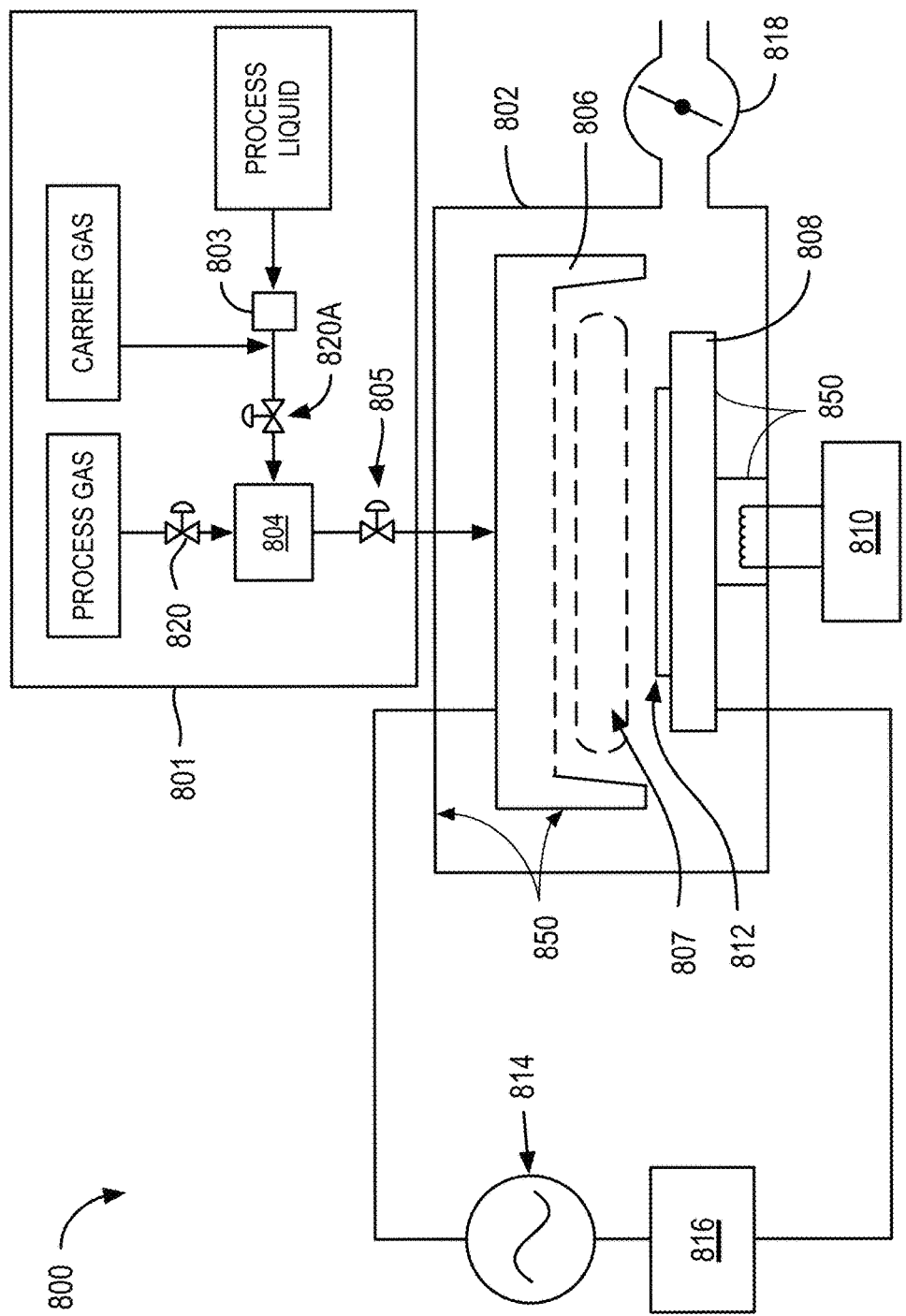
FIG. 8 schematically illustrates a substrate processing station suitable for performing film-forming ALD operations such as those employed in the methods disclosed herein.
Figure 9:
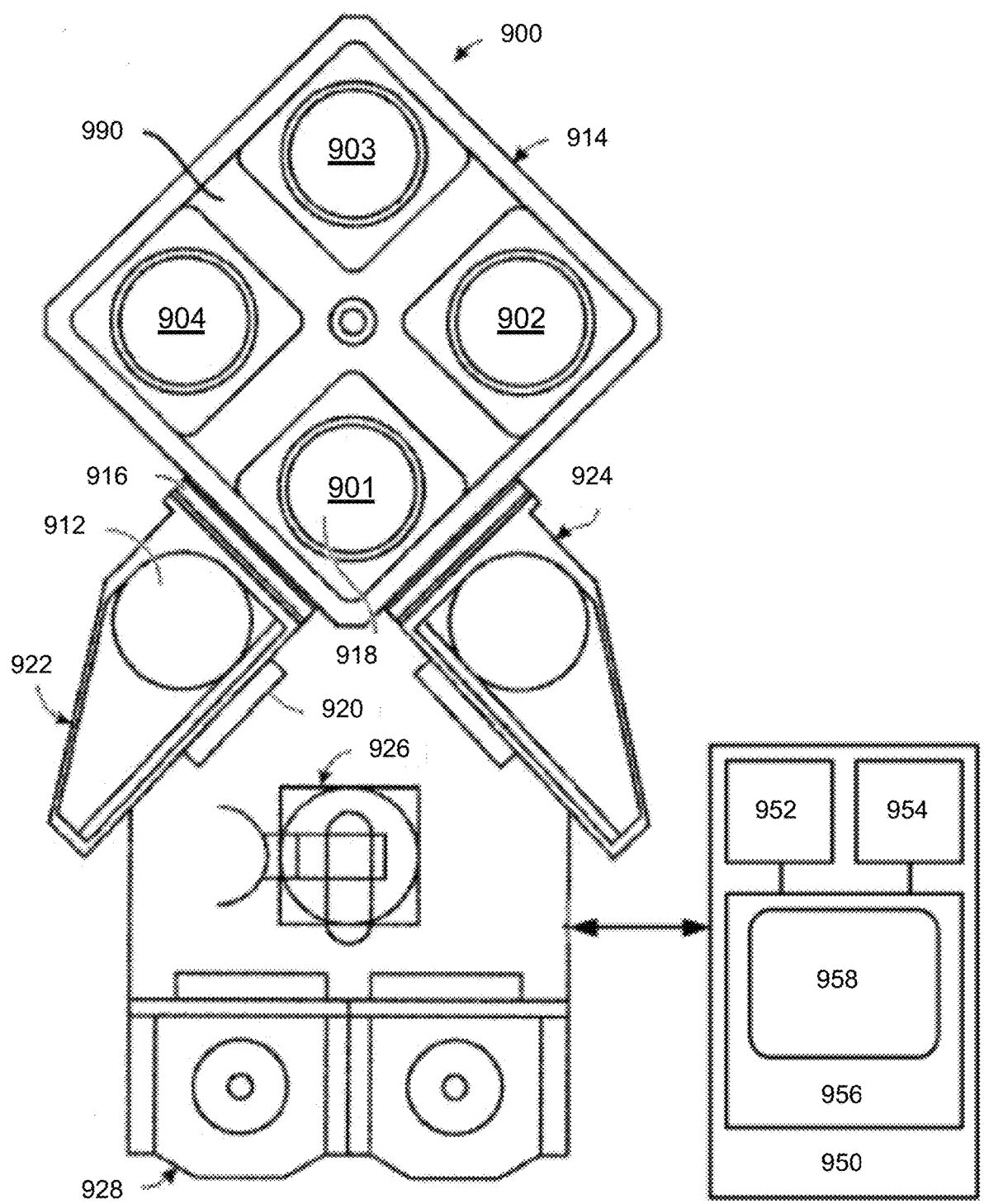
FIG. 9 schematically illustrates a multi-station substrate processing tool suitable for performing film-forming ALD operations such as those employed in the methods disclosed herein.

Accordingly, FIG. 8 schematically shows an embodiment of a reaction chamber process station 800. For simplicity, process station 800 is depicted as a standalone process station having a process chamber body 802 for maintaining a low-pressure environment. However, it will be appreciated that a plurality of process stations 800 may be included in a common process tool environment—e.g., within a common reaction chamber. For example, FIG. 9 depicts an embodiment of a multi-station processing tool. Further, it will be appreciated that, in some embodiments, one or more hardware parameters of process station 800, including those discussed in detail above, may be adjusted programmatically by one or more system controllers.

Process station 800 fluidly communicates with reactant delivery system 801 for delivering process gases to a distribution showerhead 806. Reactant delivery system 801 includes a mixing vessel 804 for blending and/or conditioning process gases for delivery to showerhead 806. One or more mixing vessel inlet valves 820 may control introduction of process gases to mixing vessel 804.

Some reactants may be stored in liquid form prior to vaporization and subsequent delivery to the process chamber 802. The embodiment of FIG. 8 includes a vaporization point 803 for vaporizing liquid reactant to be supplied to mixing vessel 804. In some embodiments, vaporization point 803 may be a heated liquid injection module. In some embodiments, vaporization point 803 may be a heated vaporizer. The saturated reactant vapor produced from such modules/vaporizers may condense in downstream delivery piping when adequate controls are not in place (e.g., when no helium is used in vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 803 may be heat treated. In some examples, mixing vessel 804 may also be heat treated. In one non-limiting example, piping downstream of vaporization point 803 has an increasing temperature profile extending from approximately 100° C. to approximately 150° C. at mixing vessel 804.

As mentioned, in some embodiments the vaporization point 803 may be a heated liquid injection module ("liquid injector" for short). Such a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 803.

In one scenario, a liquid injector may be mounted directly to mixing vessel 804. In another scenario, a liquid injector may be mounted directly to showerhead 806.

In some embodiments, a liquid flow controller (LFC) upstream of vaporization point 803 may be provided for controlling a mass flow of liquid for vaporization and delivery to process station 800. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 806 distributes process gases and/or reactants (e.g., dopant-containing film precursor) toward substrate 812 at the process station, the flow of which is controlled by one or more valves upstream from the showerhead (e.g., valves 820, 820A, 805). In the embodiment shown in FIG. 8, substrate 812 is located beneath showerhead 806, and is shown resting on a pedestal 808. It will be appreciated that showerhead 806 may have any suitable shape, and may have any suitable number and arrangement of ports for distributing processes gases to substrate 812.

In some embodiments, a microvolume 807 is located beneath showerhead 806.

Performing an ALD process in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 808 may be raised or lowered to expose substrate 812 to microvolume 807 and/or to vary a volume of microvolume 807. For example, in a substrate transfer phase, pedestal 808 may be lowered to allow substrate 812 to be loaded onto pedestal 808. During a deposition on substrate process phase, pedestal 808 may be raised to position substrate 812 within microvolume 807. In some embodiments, microvolume 807 may completely enclose substrate 812 as well as a portion of pedestal 808 to create a region of high flow impedance during a deposition process.

Optionally, pedestal 808 may be lowered and/or raised during portions the deposition process to modulate process pressure, reactant concentration, etc. within microvolume 807. In one scenario where process chamber body 802 remains at a base pressure during the process, lowering pedestal 808 may allow microvolume 807 to be evacuated. Example ratios of microvolume to process chamber volume include, but are not limited to, volume ratios between 1:500 and 1:10. It will be appreciated that, in some embodiments, pedestal height may be adjusted programmatically by a suitable system controller.

In another scenario, adjusting a height of pedestal 808 may allow a plasma density to be varied during plasma activation and/or treatment cycles included, for example, in an ALD or CVD process. At the conclusion of a deposition process phase, pedestal 808 may be lowered during another substrate transfer phase to allow removal of substrate 812 from pedestal 808.

While the example microvolume variations described herein refer to a height-adjustable pedestal, it will be appreciated that, in some embodiments, a position of showerhead 806 may be adjusted relative to pedestal 808 to vary a volume of microvolume 807. Further, it will be appreciated that a vertical position of pedestal 808 and/or showerhead 806 may be varied by any suitable mechanism within the scope of the present disclosure. In some embodiments, pedestal 808 may include a rotational axis for rotating an orientation of substrate 812. It will be appreciated that, in some embodiments, one or more of these example adjustments may be performed programmatically by one or more suitable system controllers having machine-readable instructions for performing all or a subset of the foregoing operations.

Returning to the embodiment shown in FIG. 8, showerhead 806 and pedestal 808 electrically communicate with RF power supply 814 and matching network 816 for powering a plasma. In some embodiments, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 814 and matching network 816 may be operated at any suitable power to form a plasma having a desired composition of radical species. Examples of suitable powers are included above. Likewise, RF power supply 814 may provide RF power of any suitable frequency. In some embodiments, RF power supply 814 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy (OES) sensors. In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert (e.g., helium) and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 milliseconds to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD cycles.

In some embodiments, pedestal 808 may be temperature controlled via heater 810. Further, in some embodiments, pressure control for process station 800 may be provided by one or more valve-operated vacuum sources such as butterfly valve 818. As shown in the embodiment of FIG. 8, butterfly valve 818 throttles a vacuum provided by a downstream vacuum pump (not shown). However, in some embodiments, pressure control of process station 800 may also be adjusted by varying a flow rate of one or more gases introduced to process station 800. In some embodiments, the one or more valve-operated vacuum sources-such as butterfly valve 818—may be used for removing dopant-containing film precursor from the volumes surrounding the process stations during the appropriate ALD operational phases.

As described above, one or more process stations may be included in a multi-station substrate processing tool. FIG. 9 schematically illustrates an example of a multi-station processing tool 900 which includes a plurality of process stations 901, 902, 903, 904 in a common low-pressure processing chamber 914. By maintaining each station in a low-pressure environment, defects caused by vacuum breaks between film deposition processes may be avoided.

As shown in FIG. 9, the multi-station processing tool 900 has an inbound load lock 922 and an outbound load lock 924, either or both of which may comprise a remote plasma source. A robot 926, at atmospheric pressure, is configured to move wafers from a cassette loaded through a pod 928 into inbound load lock 922 via an atmospheric port 920. A wafer is placed by the robot 926 on a pedestal 912 in the inbound load lock 922, the atmospheric port 920 is closed, and the load lock is pumped down. Where the inbound load lock 922 comprises a remote plasma source, the wafer may be exposed to a remote plasma treatment in the load lock prior to being introduced into a processing chamber 914. Further, the wafer also may be heated in the inbound load lock 922, for example, to remove moisture and adsorbed gases. Next, a chamber transport port 916 to processing chamber 914 is opened, and another robot (not shown) places the wafer into the processing chamber on a pedestal 918 at process station 901. While the embodiment depicted in FIG. 9 includes load locks, it will be appreciated that, in some embodiments, direct entry of a wafer substrate into a processing chamber may be provided.

The depicted processing chamber 914 shown in FIG. 9 provides four process stations, 901, 902, 903, and 904. Each station has a heated pedestal (shown at 918 for process station 901) and gas line inlets. It will be appreciated that in some embodiments, each process station may have different or multiple purposes. For example, in some embodiments, a process station may be switchable between an ALD process mode and a CVD process mode. Additionally or alternatively, in some embodiments, processing chamber 914 may include one or more matched pairs of ALD/CVD process stations. While the depicted processing chamber 914 comprises 4 process stations, it will be understood that a processing chamber according to the present disclosure may have any suitable number of stations. For example, in some embodiments, a processing chamber may have 1, or 2, or 3, or 4, or 5, or 6, or 7, or 8, or 9, or 10, or 11, or 12, or 13, or 14, or 15, or 16, or more process stations (or a set of embodiments may be described as having a number of process stations per reaction chamber within a range defined by any pair of the foregoing values, such as having 2 to 6 process stations per reaction chamber, or 4 to 8 process stations per reaction chamber, or 8 to 16 process stations per reaction chamber, etc.).

FIG. 9 also depicts an embodiment of a wafer handling system 990 for transferring wafers within processing chamber 914. In some embodiments, wafer handling system 990 may transfer wafers between various process stations and/or between a process station and a load lock. It will be appreciated that any suitable wafer handling system may be employed. Non-limiting examples include wafer carousels and wafer handling robots.

FIG. 9 also depicts an embodiment of a system controller 950 employed to control process conditions and hardware states of process tool 900 and its process stations. System controller 950 may include one or more memory devices 956, one or more mass storage devices 954, and one or more processors 952. Processor 952 may include one or more CPUs, ASICs, general-purpose computer(s) and/or specific purpose computer(s), one or more analog and/or digital input/output connection(s), one or more stepper motor controller board(s), etc.

In some embodiments, system controller 950 controls some or all of the operations of process tool 900 including the operations of its individual process stations. System controller 950 may execute machine-readable system control instructions 958 on processor 952—the system control instructions 958, in some embodiments, loaded into memory device 956 from mass storage device 954. System control instructions 958 may include instructions for controlling the timing, mixture of gaseous and liquid reactants, chamber and/or station pressure, chamber and/or station temperature, wafer temperature, target power levels, RF power levels, RF exposure time, substrate pedestal, chuck, and/or susceptor position, and other parameters of a particular process performed by process tool 900. These processes may include various types of processes including, but not limited to, processes related to deposition of film on substrates. System control instructions 958 may be configured in any suitable way. For example, various process tool component subroutines or control objects may be written to control operation of the process tool components necessary to carry out various process tool processes. System control instructions 958 may be coded in any suitable computer readable programming language. In some embodiments, system control instructions 958 are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 958 may include input/output control (IOC) sequencing instructions for controlling the various parameters described above. For example, each phase of a deposition process or processes may include one or more instructions for execution by system controller 950. The instructions for setting process conditions for a dopant-containing film deposition process phase, for example, may be included in a corresponding deposition recipe phase, and likewise for a capping film deposition phase. In some embodiments, the recipe phases may be sequentially arranged, so that all instructions for a process phase are executed concurrently with that process phase.

Other computer-readable instructions and/or programs stored on mass storage device 954 and/or memory device 956 associated with system controller 950 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal 918 and to control the spacing between the substrate and other parts of process tool 900. The positioning program may include instructions for appropriately moving substrates in and out of the reaction chamber as necessary to deposit dopant-containing and capping films on the substrates.

A process gas control program may include instructions for controlling gas composition and flow rates and optionally for flowing gas into the volumes surrounding one or more process stations prior to deposition in order to stabilize the pressure in these volumes. In some embodiments, the process gas control program may include instructions for introducing certain gases into the volume(s) surrounding the one or more process stations within a processing chamber during deposition of a dopant-containing film on a substrates, and for introducing different gases during deposition of a capping film on the substrates. The process gas control program may also include instructions to deliver these gases at the same rates, for the same durations, or at different rates and/or for different durations depending on the composition of the film being deposited. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates.

A heater control program may include instructions for controlling the current to a heating unit that is used to heat the substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates.

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during deposition of the dopant-containing film and capping film types on the substrates.

In some embodiments, there may be a user interface associated with system controller 950. The user interface may include a display screen, graphical software displays of the apparatus and/or process conditions, and user input devices such as pointing devices, keyboards, touch screens, microphones, etc.

In some embodiments, parameters adjusted by system controller 950 may relate to process conditions. Non-limiting examples include process gas compositions and flow rates, temperatures, pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of system controller 950 from various process tool sensors. The signals for controlling the processes may be output on the analog and/or digital output connections of process tool 900. Non-limiting examples of process tool sensors that may be monitored include mass flow controllers (MFCs), pressure sensors (such as manometers), thermocouples, etc. Appropriately programmed feedback and control algorithms may be used with data from these sensors to maintain process conditions.

System controller 950 may provide machine-readable instructions for implementing the above-described deposition processes. The instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute machine-readable instructions so that the apparatus will perform operations in accordance with the processes disclosed herein. Machine-readable, non-transitory media containing instructions for controlling operations in accordance with the substrate doping processes disclosed herein may be coupled to the system controller.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

Lithographic patterning of a film typically includes some or all of the following operations, each operation enabled with a number of possible tools: (1) application of photoresist on a substrate, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4)

developing the resist so as to selectively remove resist and thereby pattern it using a tool such as a wet bench or a spray developer; (5) transferring the resist pattern into an underlying film or substrate by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

Other Embodiments

Although the foregoing disclosed processes, methods, systems, apparatuses, and compositions have been described in detail within the context of specific embodiments for the purpose of promoting clarity and understanding, it will be apparent to one of ordinary skill in the art that there are many alternative ways of implementing these processes, methods, systems, apparatuses, and compositions which are within the spirit of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

The invention claimed is:

1. A method of depositing a film comprising silicon and oxygen onto a substrate, the method comprising:
   (a) providing the substrate in a chamber;
   (b) introducing into the chamber a silicon-containing precursor selected from the group consisting of caged siloxanes;
   (c) purging the chamber with a purge gas;
   (d) introducing an oxidant into the chamber; and
   (e) purging the chamber with the purge gas,
   wherein (b)-(e) are repeated until a desired thickness of the film is deposited.

2. The method of claim 1, wherein the oxidant is selected from the group consisting of oxygen, ozone, hydrogen, nitrous oxide, carbon monoxide, and mixtures thereof.

3. The method of claim 1, wherein the oxidant comprises an oxidative plasma.

4. The method of claim 3, wherein the oxidative plasma is generated in the chamber housing the substrate.

5. The method of claim 3, wherein the oxidative plasma is generated remotely.

6. The method of claim 1, wherein the film comprises carbon.

7. The method of claim 6, wherein a concentration of carbon in the film is between about 1 and 4 $g/cm^3$.

8. The method of claim 1, wherein the film is formed at a temperature between about 25° C. and 450° C.

9. The method of claim 1, wherein the silicon-containing precursor is selected from the group consisting of silsesquioxane.

10. The method of claim 1, wherein the silicon-containing precursor is chemically adsorbed onto a surface of the substrate to form a chemisorbed precursor on the surface of the substrate.

11. The method of claim 10, wherein introducing the oxidant is performed after purging the chamber in (c) and wherein the oxidant reacts with chemisorbed precursor on the surface of the substrate.

12. The method of claim 10, wherein the substrate is heated.

* * * * *